United States Patent
Seno

(10) Patent No.: US 8,225,244 B2
(45) Date of Patent: Jul. 17, 2012

(54) LARGE SCALE INTEGRATION DEVICE AND LARGE SCALE INTEGRATION DESIGN METHOD INCLUDING BOTH A NORMAL SYSTEM AND DIAGNOSTIC SYSTEM

(75) Inventor: Shuntaro Seno, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/303,638

(22) PCT Filed: Nov. 6, 2008

(86) PCT No.: PCT/JP2008/003218
§ 371 (c)(1),
(2), (4) Date: Dec. 5, 2008

(87) PCT Pub. No.: WO2010/052754
PCT Pub. Date: May 14, 2010

(65) Prior Publication Data
US 2011/0209108 A1    Aug. 25, 2011

(51) Int. Cl.
*G06F 17/50* (2006.01)
*G01R 31/28* (2006.01)

(52) U.S. Cl. ......... 716/102; 716/104; 716/106; 714/724

(58) Field of Classification Search .................. None
See application file for complete search history.

(56) References Cited

U.S. PATENT DOCUMENTS

| 5,995,736 A | 11/1999 | Aleksic et al. |
| 6,823,497 B2 * | 11/2004 | Schubert et al. ............ 716/106 |
| 6,959,428 B2 * | 10/2005 | Broberg et al. ............. 716/102 |
| 7,360,180 B2 * | 4/2008 | Seno ............................ 716/102 |
| 7,904,856 B2 * | 3/2011 | Seno ............................ 716/104 |
| 2003/0131325 A1 | 7/2003 | Schubert et al. |
| 2004/0261050 A1 | 12/2004 | Broberg, III et al. |

FOREIGN PATENT DOCUMENTS

| JP | 2007-042085 | 2/2007 |
| WO | WO 2010 052754 A1 * | 5/2010 |

OTHER PUBLICATIONS

PCT International Search Report, PCT/JP/2008/003218, Jun. 15, 2009, 4 pages.*
PCT Written Opinion of the Internation Searching Authority, PCT/JP2008/003218, 8 pages.*
Kim, et al., "An integrated hardware-software cosimulation environment with automated interface generation", Jun. 19, 1996, pp. 66-71.

* cited by examiner

*Primary Examiner* — Leigh Garbowski
*Assistant Examiner* — A. M. Thompson
(74) *Attorney, Agent, or Firm* — Antonelli, Terry, Stout & Kraus, LLP.

(57) ABSTRACT

The LSI design apparatus adds diagnostic circuitry for micro diagnosis to a behavior level description. Based on behavior level design data for a normal system of a LSI, high level synthesis generates RTL design data and register information. Based on the register information, a unique address used by a micro diagnosis program is allocated to each register. Circuit components within the normal system are grouped together. Based on the result of the address allocation and the result of the grouping, a behavior description for diagnostic circuits constituting a diagnosis system for the LSI is generated and added to the behavior level design data for the normal system, resulting in behavior level design data in which the normal and diagnosis systems are integrated together.

20 Claims, 30 Drawing Sheets

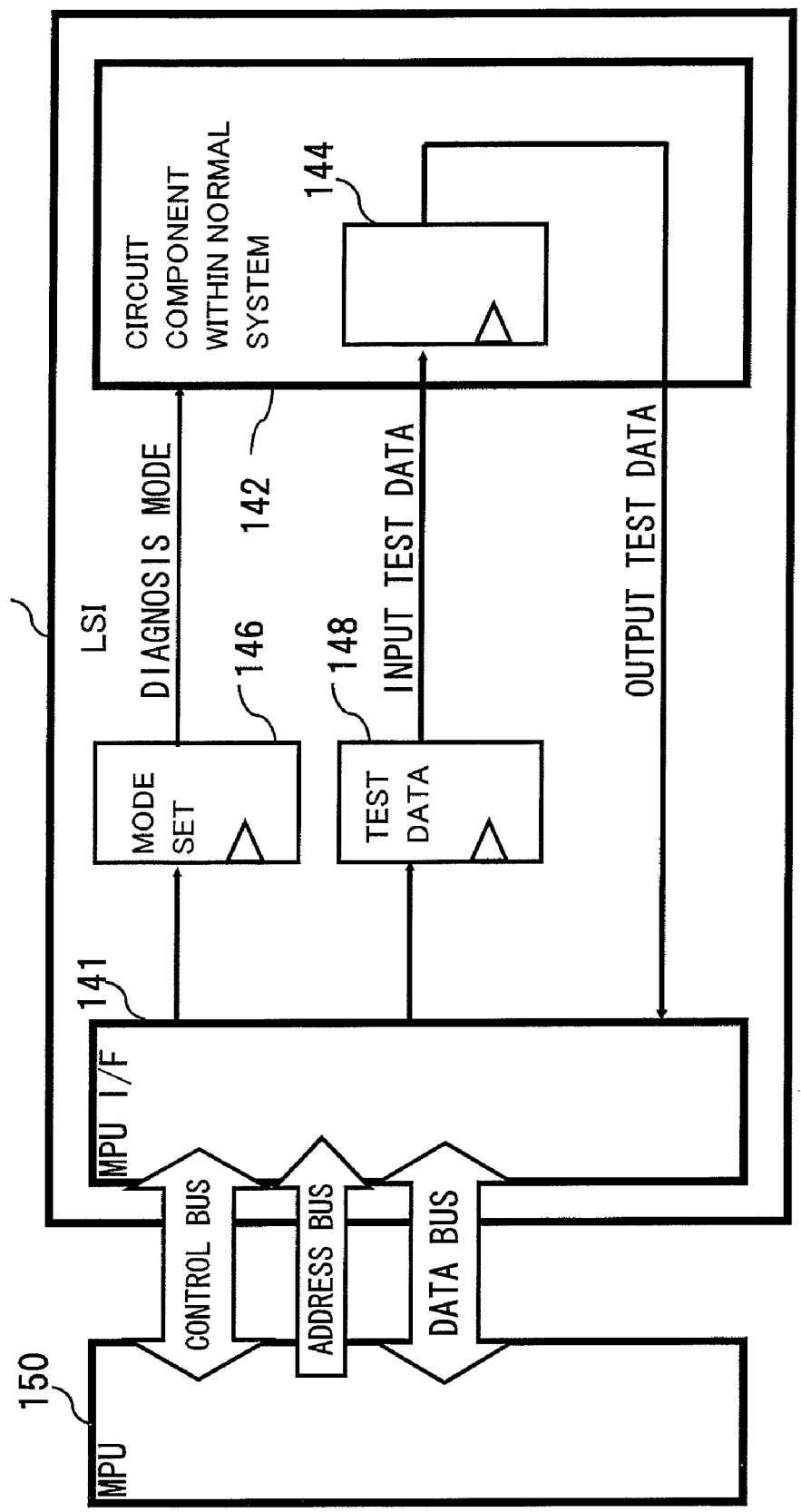

FIG. 14A — 250

| BLOCK LAYER | SUB-BLOCK LAYER | VARIABLE NAME | BIT LENGTH | VARIABLE ATTRIBUTE |
|---|---|---|---|---|
| BLK | SBLK | VAL | 8 | LV |
| . | . | . | . | . |

FIG. 14B — 252

| BLOCK LAYER | SUB-BLOCK LAYER | RESISTER NAME |
|---|---|---|
| BLK | SBLK | VAL_REG |
| . | . | . |

FIG. 14C — 198

| BLOCK LAYER | SUB-BLOCK LAYER | VARIABLE NAME | RESISTER NAME | BIT LENGTH | VARIABLE ATTRIBUTE |
|---|---|---|---|---|---|
| BLK | SBLK | VAL | VAL_REG | 8 | LV |
| . | . | . | . | . | . |

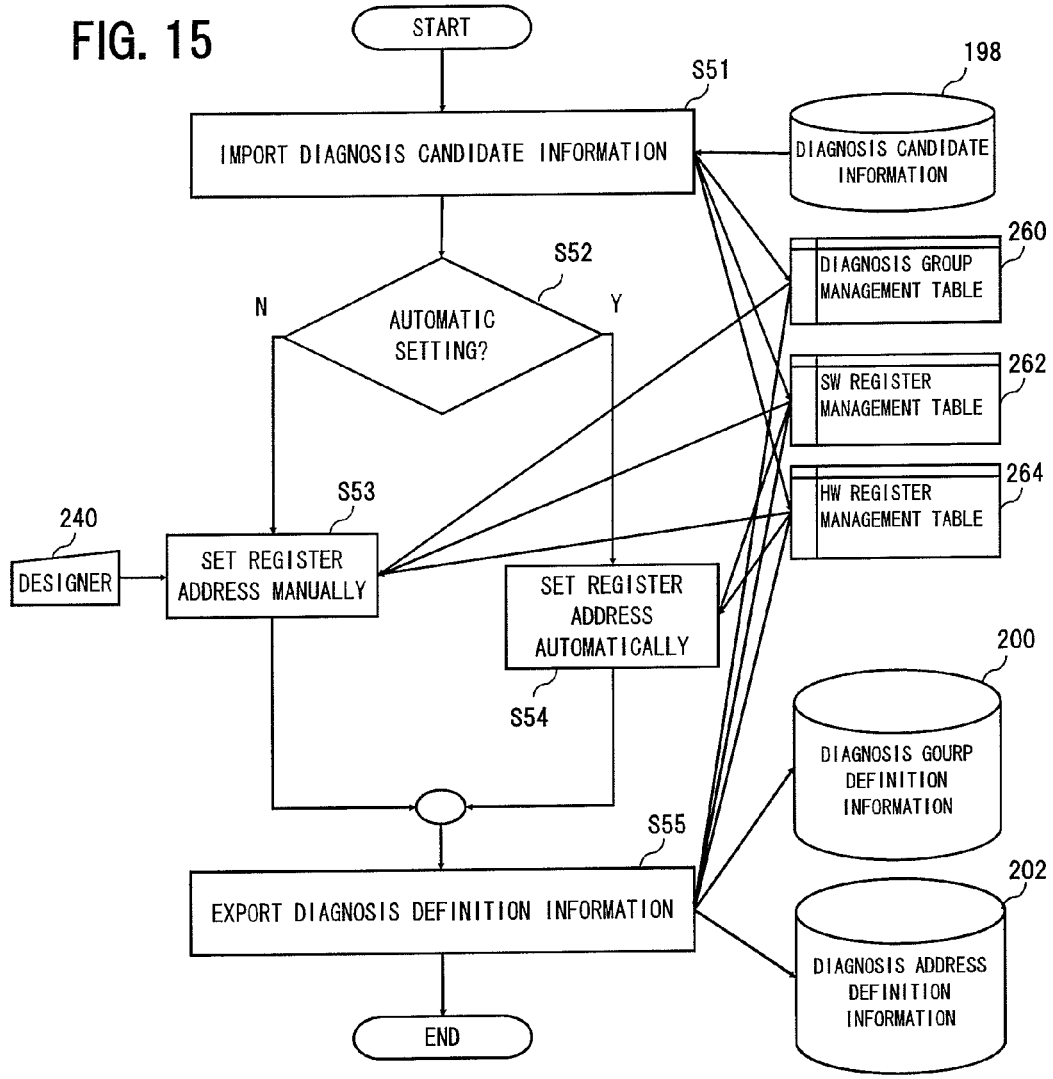

FIG. 16A

| DIAGNOSIS GROUP ID | HIGHER RANKING ADDRESS |
|---|---|
| 0 | 0x0000 |
| . | . |

| SW REGISTER NAME | SW REGISTER ATTRIBUTE | LOWER RANKING ADDRESS | DIAGNOSIS GROUP ID |
|---|---|---|---|
| REG00 | MODE | 0x0000 | 0 |
| . | . | . | . |

| HW REGISTER NAME | SW REGISTER NAME | START BIT POSITION | END BIT POSITION | BLOCK LAYER NAME | SUB-BLOCK LAYER NAME | VARIABLE ATTRIBUTE |
|---|---|---|---|---|---|---|
| VAL | REG00 | 31 | 16 | BLK0 | SBLK0 | LV |
| . | . | . | . | . | . | . |

| DIAGNOSIS GROUP ID | HIGHER RANKING ADDRESS | | | LOWER RANKING ADDRESS | | | | SW REGISTER NAME | SW REGISTER ATTRIBUTE |
|---|---|---|---|---|---|---|---|---|---|
| 0 | 0 | 0 | 0 | 0 | 0 | 0 | 0 | REG00 | MODE |
|   |   |   |   | 0 | 0 | 0 | 4 | REG01 | TEST |
|   |   |   |   | 0 | 0 | 0 | 8 | REG02 | TEST |
|   |   |   |   | 0 | 0 | 0 | C | REG03 | DIAG |
| 1 | 0 | 0 | 4 | 0 | 0 | 1 | 0 | REG04 | DIAG |
|   |   |   |   | 0 | 0 | 1 | 4 | REG05 | DIAG |
|   |   |   |   | 0 | 0 | 1 | 8 | REG06 | DIAG |
| 2 | 0 | 0 | 8 | 0 | 0 | 0 | 0 | REG07 | DIAG |
| ... |   |   |   |   |   |   |   | ... |   |

| DIAGNOSIS GROUP ID | SW RESISTER NAME | SW RESISTER ATTRIBUTE | BLOCK LAYER NAME | SUB-BLOCK LAYER NAME |
|---|---|---|---|---|
| 0 | REG02 | DIAG | BLK0 | SBLK00 |

| BYTE | BIT | HW REGISTER NAME |
|---|---|---|
| +0 | 31 | STATEVAR |
| | 30 | |
| | 29 | |
| | 28 | |
| | 27 | |
| | 26 | |
| | 25 | |
| | 24 | |
| +1 | 23 | CNT |
| | 22 | |
| | 21 | |
| | 20 | |
| | 19 | |
| | 18 | |
| | 17 | |
| | 16 | |
| +2 | 15 | DOUT(31:16) |
| | 14 | |
| | 13 | |
| | 12 | |
| | 11 | |
| | 10 | |
| | 9 | |
| | 8 | |
| +3 | 7 | |
| | 6 | |
| | 5 | |
| | 4 | |
| | 3 | |
| | 2 | |
| | 1 | |
| | 0 | |

| DIAGNOSIS GROUP ID | HIGHER RANKING ADDRESS |
|---|---|
| 0 | 0x0000 |
| 1 | 0x0001 |
| . | . |

| DIAGNOSIS GROUP ID | SW REGISTER NAME | SW REGISTER ATTRIBUTE | LOWER RANKING ADDRESS | HW REGISTER NAME | START BIT POSITION | END BIT POSITION | BLOCK LAYER NAME | SUB-BLOCK LAYER NAME | VARIABLE ATTRIBUTE |
|---|---|---|---|---|---|---|---|---|---|
| 0 | REG00 | MODE | 0x0000 | MODE | 31 | 31 | NONE | NONE | NONE |
| 0 | REG01 | TEST | 0x0004 | TEST | 31 | 0 | NONE | NONE | NONE |
| 0 | REG02 | DIAG | 0x0008 | STATEVAR | 31 | 24 | BLK0 | SBLK00 | ST |
| 0 | REG02 | DIAG | 0x0008 | CNT | 23 | 16 | BLK0 | SBLK00 | LV |
| 0 | REG02 | DIAG | 0x0008 | DOUT(31:16) | 15 | 0 | BLK0 | SBLK00 | CH |
| 0 | REG03 | DIAG | 0x000C | DOUT(15:0) | 31 | 16 | BLK0 | SBLK01 | CH |
| . | . | . | . | . | . | . | . | . | . |

202

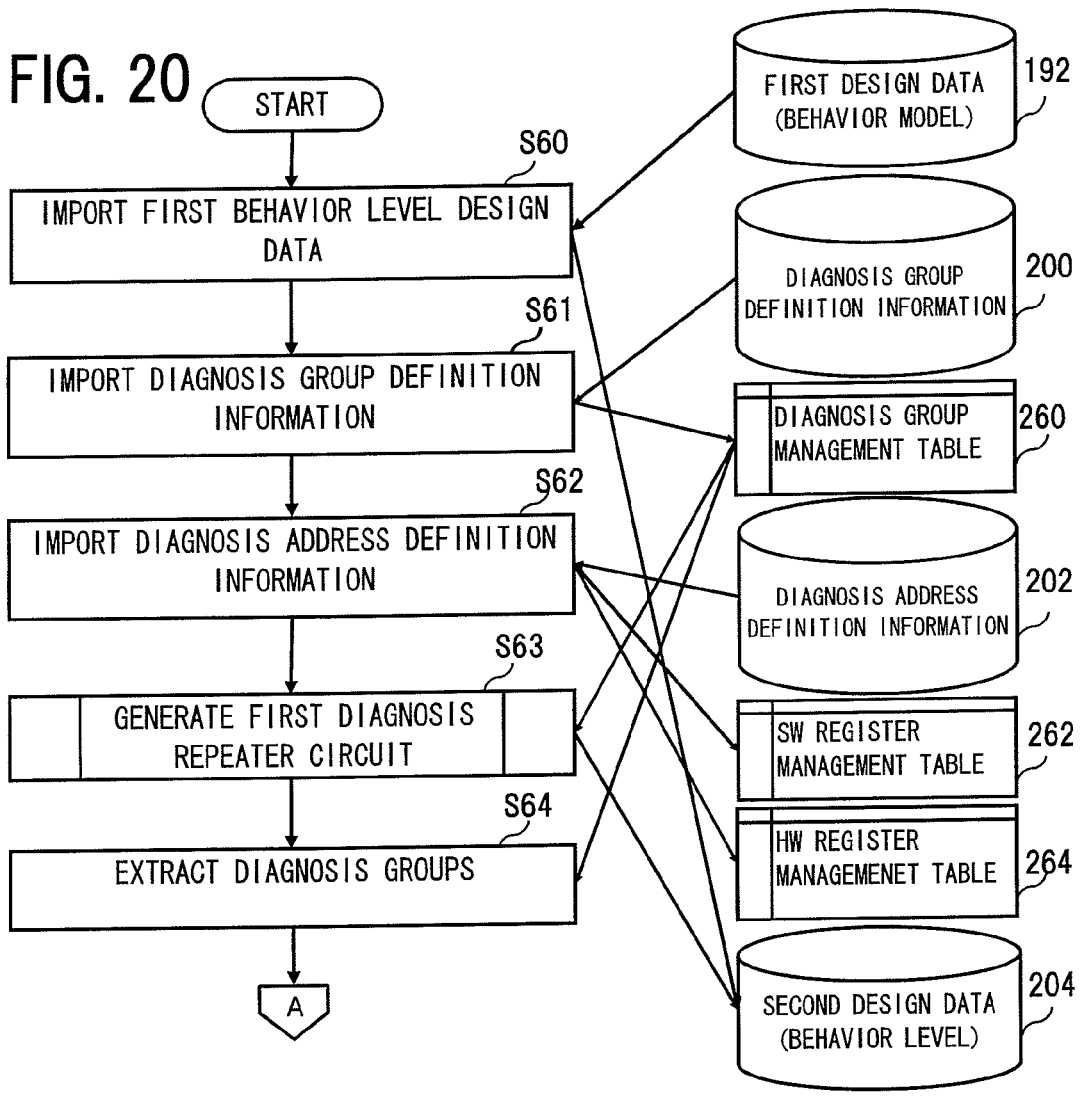

LARGE SCALE INTEGRATION DEVICE AND LARGE SCALE INTEGRATION DESIGN METHOD INCLUDING BOTH A NORMAL SYSTEM AND DIAGNOSTIC SYSTEM

TECHNICAL FIELD

The present invention relates to an apparatus, a method, and a computer program for designing an LSI (Large Scale Integration), and for example relates to such a device, a method, and a computer program which may be applied to designing a LSI logical circuit which is used in a storage device. The present invention also relates to an LSI designed by the above apparatus and/or method.

BACKGROUND ART

Since a high reliability computer system, of which a storage device is representative, can be continually operated for 24 hours per day and 365 days per year, accordingly such a system is endowed with a plurality of functions for detecting any fault in the hardware which is used internally to the storage device at an early stage, in order to ensure that the storage device operates stably. For example, in relation to an LSI which performs data transfer internally in the storage device, it is known for an MPU to execute a diagnosis program for this LSI, and for a micro diagnosis function to diagnose internal faults of this LSI. It is a popular method for diagnosing an LSI that the LSI is connected to an external diagnosis device, which detects any faults in the LSI, in a manufacturing process of the LSI. The above-mentioned micro diagnosis has its advantage in that detecting faults can be performed while the storage device is working, since the MPU diagnoses the LSI using a program.

Nowadays, in the design technology for LSIs, RTL (Register Transfer Level) design is mainstream. RTL is a degree of logical abstraction of the LSI. In RTL, a so called hardware description language (HDL) such as VHDL or Verilog-HDL is used as a programming language, and the flow of data is described for each register to register as a unit. And, by using so called logic synthesis tool software, source code in an HDL which is described at RTL is automatically converted to a so called GATE level net list circuit diagram, in which IC cells are connected one another.

However, in recent years, due to increase of the scale of semiconductor integration and increase of the complication of design specifications, the amount of design work per each individual designer has increased, and, in RTL design, the design task has come to occupy a very great period of time, so that it has become difficult to ensure the required quality of design.

In response to this type of situation, in recent years, methods have started to be employed for raising the level of design abstraction from RTL to the behavior level (for example, refer to Patent Citation 1). In concrete terms, this is a method in which the operation of the LSI is described in a high level language such as the C language, and then is automatically converted to HDL source code at RTL using so called high level synthesis tool software. It is possible to enhance the productivity and the quality of the LSI design task by designing at the behavior level using such a high level synthesis tool.
[Patent Citation 1]
Japanese Laid-Open Patent Publication 2007-42085.

DISCLOSURE OF INVENTION

In recent years, due to increase of the scale of integration of LSIs, the number of internal registers in an LSI has been increasing year by year. Due to this, the number of registers for which micro diagnosis must be performed increases, the work imposed upon the designer for adding diagnostic circuitry for micro diagnosis of the various registers and the man-hours needed for checking increase, and it becomes easy for faults to occur due to simple mistakes.

However, in RTL design, the addition of diagnostic circuitry, itself, is comparatively easy. The reason why is that, since in RTL design the designer arranges the registers explicitly, accordingly it is possible to specify the registers to be the subjects of diagnosis clearly, and the addition of diagnostic circuitry can be performed in a standardized and correct manner.

By contrast, in behavior level design, it is difficult to add diagnostic logic, which corresponds to diagnostic circuitry. The reason why is that, since the determination of the conversion from variables which are described at the behavior level to registers is performed by the high level synthesis tool, accordingly, at the stage of constructing the behavior level description, the designer cannot specify the registers (i.e., the variables) which must be diagnosed. Moreover another reason is that, even supposing that it were possible to specify the registers for which diagnostic logic should be added, if diagnostic logic is added into the behavior level description by hand, then there is a high possibility that, from the description to which the diagnostic logic is added, the high level synthesis tool will output a circuit construction (RTL) other than the intended one.

If, in this manner, only micro diagnosis is considered, then it may be said that, as compared with behavior level design, RTL design is the easier design technique from the point of view of the designer. Accordingly the first problem in LSI design for a high reliability computer system for which micro diagnosis is an essential premise, such as a storage device, is that it becomes difficult to enhance productivity and product quality by applying design at the behavior level.

On the other hand, since the degree of abstraction of a description at the behavior level is higher as compared with an RTL description, the simulation speed for verification is extremely high. In verification in which a high simulation speed is required, such as verification of the architecture of an LSI or the like, descriptions at the behavior level are widely used. In micro diagnosis as well, it is necessary to perform verification of the diagnostic circuitry which is added and verification of the diagnosis program which is executed by the MPU, and high speed simulation is necessary in order to perform the required increasing number of diagnosis.

In order to solve the first problem described above, a method has been considered of adding diagnostic circuitry by hand to the RTL which has been outputted by the high level synthesis tool. However the second problem arises that, since the simulation speed is slow with RTL, accordingly the speed for verification of the micro diagnosis becomes low. Thus, in order to enhance the verification speed for the micro diagnosis, it is necessary to add the diagnostic circuitry at the behavior level stage, so as to implement high speed simulation.

Furthermore, since in micro diagnosis a large number of registers internal to the LSI are monitored, the output signals of this large number of registers are liable to become concentrated in the MPU interface circuit unit of the LSI. Accordingly, in the configuration and wiring processes of LSI design, the inconveniences of wiring concentration or long distance wiring or the like can easily occur.

In order to mitigate this type of wiring concentration and long distance wiring, in prior art design, the tasks have been performed by hand of providing a large number of intermediate circuits within the LSI, of consolidating the output signals of a plurality of registers into one output signal within these intermediate circuits, and of connecting the output signal lines of those intermediate circuits to a MPU interface circuit. However, since these tasks do not simply consist of consolidation of signals, but also the task arises of merging the addresses which are allocated to the various registers, accordingly they must be performed by hand, and cannot be automated by a configuration and wiring tool.

However, when the above described tasks are performed by hand, due to the troublesome nature of merging the addresses and so on, it is easy for a human being to make a mistake, and accordingly the third problem arises that there is a danger of the productivity and quality of the LSI design process being deteriorated.

An objective of the present invention is, in the process of LSI design at the behavior level in which a high level synthesis tool is employed, to provide an automated design system which can automatically add diagnostic circuitry to the description at the behavior level without losing productivity, and which makes it possible to insert intermediate circuitry automatically in consideration of the arrangement and wiring of the various circuit elements.

The LSI design apparatus which is provided according to one aspect of the present invention is an LSI design apparatus for designing an LSI having a normal system for performing normal functions, and a diagnosis system for communicating with a diagnosis program which is executed externally and diagnosing said normal system, comprising:

a behavior model design device which generates first behavior level design data, in which the logic of said normal system in said LSI is described, and including a plurality of variables;

a high level synthesis device which inputs said first behavior level design data, and, on the basis of said first behavior level design data, generates first register transfer level (RTL) design data in which the logic of said normal system is described and in which a plurality of hardware registers are included, and a high level synthesis log which specifies said plurality of hardware registers within said first RTL design data;

a diagnosis candidate analysis device which inputs said first behavior level design data and said high level synthesis log, and, on the basis of said first behavior level design data and said high level synthesis log, detects, from a plurality of variables within said first behavior level design data, a plurality of diagnosis candidate variables which respectively correspond to said plurality of hardware registers within said first RTL design data, and generates diagnosis candidate information in which said mutually corresponding plurality of diagnosis candidate variables and said plurality of hardware registers are specified;

a register address setting device which inputs said diagnosis candidate information, maps said plurality of hardware registers which are specified in said diagnosis candidate information onto a software address space which is used by said diagnosis program, and generates diagnosis address definition information which specifies the address positions of a plurality of registers in said software address space; and a diagnostic logic automatic generation device which inputs said first behavior level design data and said diagnostic address definition information, and, on the basis of said first behavior level design data and said diagnostic address definition information, generates second behavior level design data for said LSI, in which both said normal system and said diagnosis system are included;

wherein said high level synthesis device further inputs said second behavior level design data, and, on the basis of said second behavior level design data, generates second RTL design data, in which is described completed logic which includes both logic for said normal system and logic for said diagnosis system; and said LSI design apparatus further comprising a logic synthesis device which inputs said second RTL design data, and, on the basis of said second RTL design data, generates gate level design data in which said completed logic is described.

With the LSI design apparatus according to one embodiment of the present invention, said first behavior level design data describes said normal system as a hierarchical structured behavior model, having a plurality of block layers, a plurality of sub-block layers included in each of said plurality of block layers, and a plurality of variables included in each of said plurality of sub-block layers.

In a refinement of the embodiment described above:

said diagnosis candidate analysis device, on the basis of said first behavior level design data, further specifies, from among said plurality of block layers, a plurality of diagnosis candidate sub-blocks in which said plurality of diagnosis candidate variables are included, and a plurality of diagnosis candidate block layers in which said plurality of diagnosis candidate sub-blocks are included, and generates said diagnosis candidate information so that said diagnosis candidate information further specifies said plurality of diagnosis candidate block layers;

said register address setting device, on the basis of said diagnosis candidate information, groups said plurality of diagnosis candidate block layers into a plurality of diagnosis groups the number of which is smaller than the number of said diagnosis candidate block layers, and further generates diagnosis group definition information which specifies which, among said plurality of diagnosis candidate block layers, each of said plurality of diagnosis groups includes; and said diagnostic logic automatic generation device further inputs said diagnosis group definition information, and, on the basis of said diagnosis address definition information and said diagnosis group definition information, generates said second behavior level design data by adding, to said first behavior level design data, behavior level design data for said diagnosis system, including:

A. a first diagnosis repeater circuit which receives from said diagnosis program input test data to be written into a variable to be diagnosed within said normal system, and returns to said diagnosis program output test data which is outputted from said variable to be diagnosed;

B. a second diagnosis repeater circuit, provided for each of said diagnosis groups, which receives said input test data from said first diagnosis repeater circuit and sends said input test data to a designated one among said plurality of diagnosis candidate block layers in said diagnosis groups, and which moreover receives said output test data from said designated one among said plurality of diagnosis candidate block layers in said diagnosis groups and returns said output test data to said first diagnosis repeater circuit;

C. an write diagnosis circuit, provided to each of said diagnosis candidate block layers in said diagnosis groups, which receives said input test data from said second diagnosis repeater circuit of said diagnosis group, and sends said input test data to a designated one among said plurality of diagnosis candidate sub-block layers in said diagnosis candidate block layers;

D. an internal diagnosis circuit, provided to each of said plurality of diagnosis candidate sub-block layers in said diagnosis candidate block layers, which receives said input test data from said write diagnosis circuit of said diagnosis candidate block layer, inputs said input test data to said variable to be diagnosed among said plurality of diagnosis candidate variables in said diagnosis candidate sub-block layer, and receives said output test data from said variable to be diagnosed;

E. a read diagnosis circuit, provided to each of said plurality of diagnosis candidate sub-block layers in said diagnosis candidate block layers, which receives said output test data from said internal diagnosis circuit in said diagnosis candidate sub-block layer; and F. an read diagnosis circuit, provided to each of said plurality of diagnosis candidate block layers in said diagnosis groups, which receives said output test data from said plurality of read diagnosis circuits in said diagnosis candidate block layer, and returns said output test data to said second diagnosis repeater circuit of said diagnosis groups.

In a refinement of the preferred embodiment described above, said diagnosis candidate analysis device, on the basis of said first behavior level design data, decides to which of a predetermined plurality of variable attributes, including the following A), B), and C), each of said plurality of diagnosis candidate variables in said sub-block layers corresponds:

A) a state management variable for specifying the state of a state machine in said sub-block layer;

B) a local variable which is referred to only within said sub-block layer; and

C) a channel variable for communication, for outputting data of a predetermined variable within said sub-block layer to a predetermined other sub-block layer;

and said diagnostic logic automatic generation device receives the result of decision by said diagnosis candidate analysis device, and generates said internal diagnosis circuit upon said first behavior level design data by, for each of said sub-block layers:

a) adding a diagnosis state to the plurality of states possessed by said state machine; b) adding a mode setting communication channel for inputting diagnosis mode setting data and normal mode setting data for causing said state machine to transit between said diagnosis state and some other predetermined state;

c) adding an input test data communication channel for, when said state machine is in said diagnosis state, inputting test data supplied from said diagnosis program to said local variable and said variable for communication channel;

d) adding a state management variable communication channel for, when said state machine is in said diagnosis state, reading out data of said state management variable to outside said sub-block layers; and e) adding a local variable communication channel for, when said state machine is in said diagnosis state, outputting data of said local variable to outside said sub-block layers.

In the embodiment described above, further, the diagnostic logic automatic generation device, upon said first behavior level design data:

i) generates a read diagnosis circuit for, when said state machine is in said diagnosis state: reading data of said state management variable via said state management variable communication channel, reading data of said local variable via said local variable communication channel, and reading data of said variable communication channel, and for sending the data which has been read to said diagnosis program; and ii) adds an intermediate communication channel for transferring data which has been read out from said variable communication channel to said diagnostic circuitry, from said diagnostic circuitry to another sub-block layer or block layer within said normal system.

The present invention also supplies a method which is performed by the LSI design apparatus described above, a computer program for causing a computer to perform that method, and an LSI which is designed by the LSI design apparatus described above.

BRIEF DESCRIPTION OF DRAWINGS

FIG. 2 is a block diagram showing a summary of LSI micro diagnosis which is designed with this embodiment of the LSI design apparatus according to the present invention.

FIG. 14A is a figure showing an example of a variable information table 250.

FIG. 14B is a figure showing an example of a register information table 252.

FIG. 14C is a figure showing another example of the variable information table 252.

FIG. 15 is a flow chart showing the flow of processing in a step S21 shown in FIG. 11 (processing which is performed by a register address setting tool 186).

FIG. 16A is a figure showing an example of a diagnosis group table 260.

FIG. 16B is a figure showing an example of a SW register management table 262.

FIG. 16C is a figure showing an example of a HW register management table 264.

FIG. 17 is a figure showing an example of a group setting screen 270 which is displayed to a designer 240 in a step S53 of FIG. 15.

FIG. 18 is a figure showing an example of a register address setting screen 272 which is displayed to the designer 240 in the step S53 of FIG. 15.

FIG. 19A is a figure showing an example of diagnosis group definition information 200.

FIG. 19B is a figure showing an example of diagnosis address definition information 202.

FIG. 20 is a part of a flow chart showing the flow of processing in a step S31 shown in FIG. 12 (processing which is performed by a diagnostic logic automatic generation tool 188).

EXPLANATION OF REFERENCE

Figure 1:
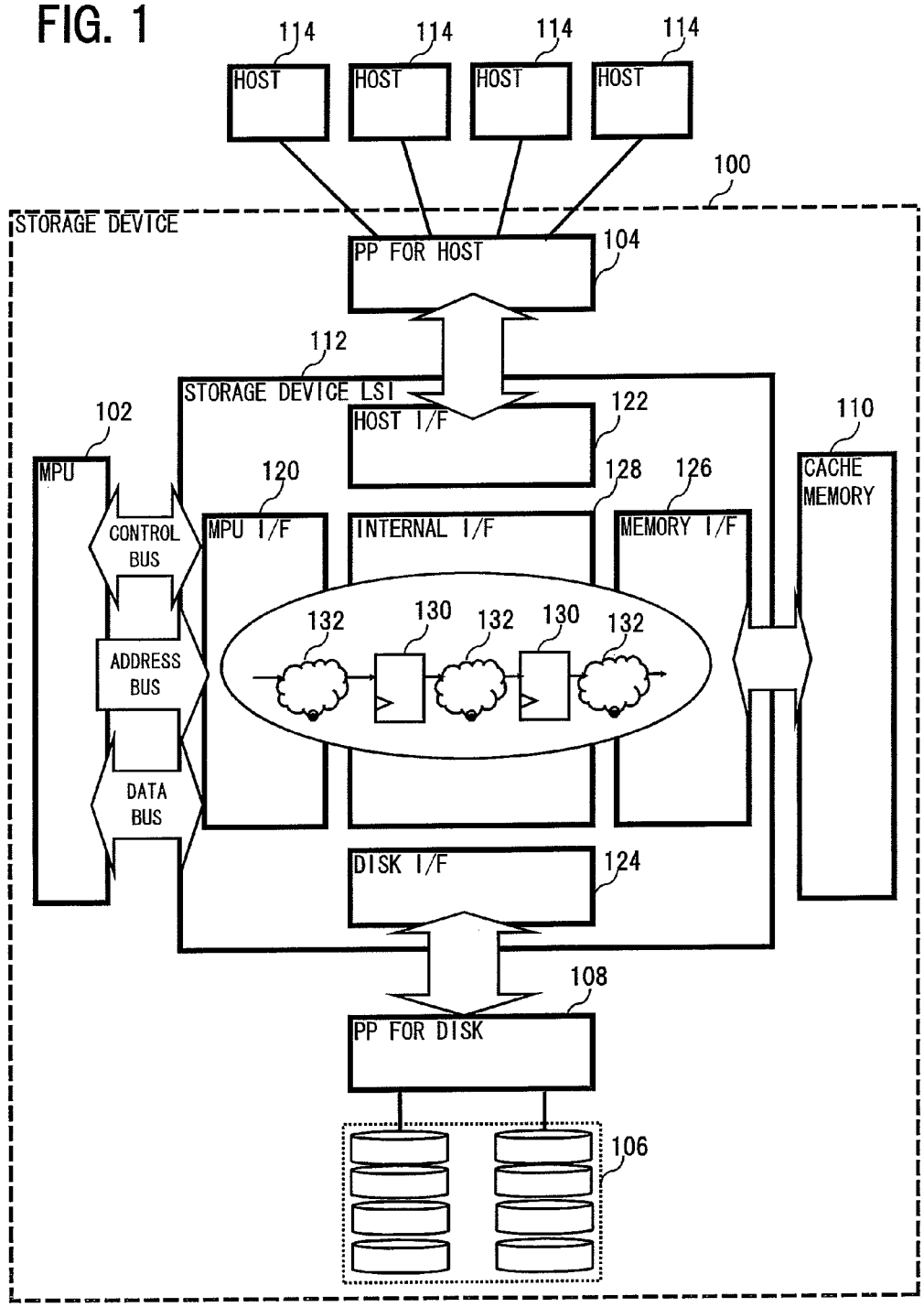
FIG. 1 is a block diagram showing the system structure of a storage device, which is one typical example of the field of application of LSIs, and which is designed with an embodiment of the LSI design apparatus according to the present invention.

100: storage device
102: MPU
112: LSI for storage device
130: register
140: LSI
142: normal system
150: MPU
162: block layer
164: sub-block layer
167: variable
170: computer
172: control terminal
180: behavior model design tool
182: high level synthesis tool
184: diagnosis candidate analysis tool
186: register address setting tool
188: diagnostic logic automatic generation tool
190: logic synthesis tool
192: first behavior level design data
194: first RTL design data
196: high level synthesis log
198: diagnosis candidate information
200: diagnosis group definition information
202: diagnosis address definition information
204: second behavior level design data
206: second RTL design data
208: GATE level design data
210: diagnosis group
212: first diagnosis repeater circuit
214: second diagnosis repeater circuit
216: write diagnosis circuit
218: internal diagnosis circuit
220: read diagnosis circuit
222: read diagnosis circuit
300: FSM
302, 308: registers
326, 336, 338, 340, 342, 344: communication channels
348: intermediate communication channels

BEST MODE FOR CARRYING OUT THE INVENTION

In the following, an embodiment of the LSI design apparatus according to the present invention will be explained with reference to the drawings.

FIG. 1 shows the system structure of a storage device which is one typical example of the field of application of LSI, and which is designed with an embodiment of the LSI design apparatus according to the present invention.

The storage device 100 shown in FIG. 1 comprises an MPU 102 for controlling the storage device 100 as a whole, a protocol for host processor 104 for communicating with one or more hosts 114, a recording disk array 106 for storing data which is used by the hosts 114, a protocol for disk processor 108 for communicating with the recording disk array 106, a cache memory 110 which temporarily stores data inputted and outputted to and from the recording disk array 106, a storage device LSI 112 which functions as an interface between these devices 102, 104, 108, and 110, and the like.

The storage device LSI 112 comprises an MPU interface circuit 120, a host interface circuit 122, a disk interface circuit 124, a memory interface circuit 126, an internal interface circuit 128, and the like, and each one of these comprises a large number of registers (for example flip-flops) 130 and a large number of combination circuits 132 (for example logic gates such as AND gates, OR gates, adders, subtracters, combinations thereof, and the like).

This storage device LSI 112 can be designed with an embodiment of the LSI design apparatus according to the present invention. The above described interface circuits 120 through 128 within the storage device LSI 112 are portions which perform the normal functions of the storage device LSI 112 (i.e. functions which are requested by its designer)and in this specification, these will be termed the "normal system" of the LSI. In addition, this storage device LSI 112 is also provided with a plurality of circuits (not shown in FIG. 1) for enabling a micro diagnosis program which is executed by the MPU 102 to perform diagnosis of the above described normal system (the diagnosis which is performed by the micro diagnosis program in this manner will be termed "micro diagnosis" in this specification); and, in this specification, these circuits for micro diagnosis will be termed the "diagnosis system". By contrast to the logic of the normal system which is normally designed by hand, the logic of the diagnosis system is automatically designed by the LSI design apparatus according to the present invention.

FIG. 2 shows a summary of micro diagnosis of an LSI (for example of the storage device LSI 112) which is designed with this embodiment of the LSI design apparatus according to the present invention.

As shown in FIG. 2, within the LSI 140, there are present various circuit components 142 which constitute the normal system (each of which corresponds to a sub-block layer which will be described hereinafter; in FIG. 2, only one of these circuit components is shown). Apart from these, there are also present various registers which are included in the diagnosis system for diagnosing the various circuit components 142 within the normal system, such as for example a mode setting register 146, a test data register 148, and so on. Unique addresses within the address space which is used by the MPU 150 (i.e. the diagnosis program) are allocated to these various registers 142, 146, and 148 within the LSI 140. If some register 144 within some circuit component 142 within the normal system is to be diagnosed, the MPU 150 (i.e. the diagnosis program) performs the steps (1) through (5) described in outline below.

(1) Via the MPU interface circuit 141, the MPU 150 (i.e. the diagnosis program) writes diagnosis mode setting data (for example 1-bit data consisting of the value "1") or normal mode setting data (for example 1-bit data consisting of the value "0") into the mode setting register 146. Writing the diagnosis mode setting data into the mode setting register 146 makes the operation mode (or the state) of the above described circuit component 142 changed over from the normal mode (i.e. the operation mode for manifesting its primary function in the normal system) to the diagnosis mode (i.e. the operation mode for performing diagnosis).

(2) The MPU 150 (i.e. the diagnosis program) sets a predetermined input test data via the MPU interface circuit 141 to the test data register 148.

(3) The MPU 150 (i.e. the diagnosis program) designates the address of the register 144 to be diagnosed within the above described circuit component 142, and commands the LSI 140 to perform writing. When this is done, the input test data which is set into the test data register 148 is copied into the register to be diagnosed 144. (Thereafter, normal mode setting data (for example 1-bit data consisting of the value "0") is written into the mode setting register 146, and the above described circuit component 142 then returns from the diagnosis mode to the normal mode.)

(4) The MPU 150 (i.e. the diagnosis program) designates the address of the register to be diagnosed 144, and commands the LSI 140 to perform writing. When this is done, the data in the register to be diagnosed 144 is returned via the MPU interface circuit 141 to the MPU 150 (i.e. to the diagnosis program) as output test data (5) The MPU 150 (i.e. the diagnosis program) checks whether or not the register to be diagnosed 144 is faulty by comparing the output test data which has been read from that register to be diagnosed 144 with the predetermined anticipated data. The MPU 150 (i.e. the diagnosis program) writes the normal mode setting data into the mode setting register 146 so that the above described circuit component 142 gets back from the diagnosis mode to the normal mode.

Figure 3A:
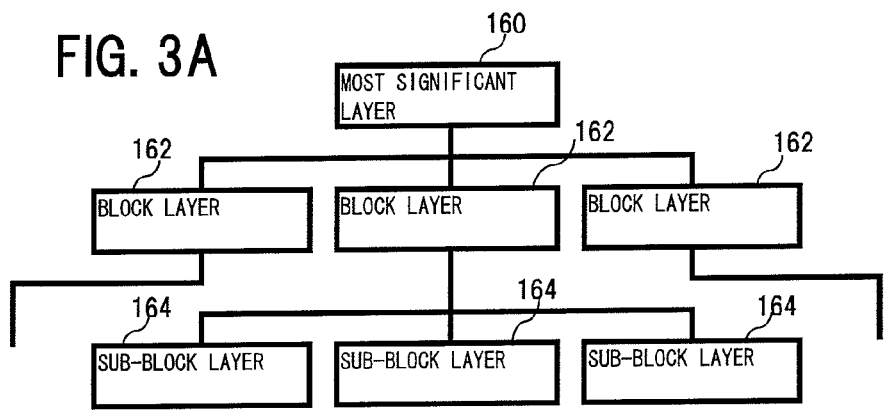
FIG. 3A is a block diagram showing an example of the structure at the behavior level of design data of a normal LSI system which is designed with this embodiment of the LSI design apparatus according to the present invention.
Figure 3B:
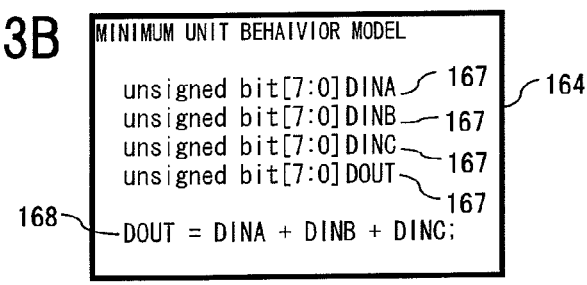
FIG. 3B is a block diagram showing an example of the structure of a sub-block layer.
Figure 3C:
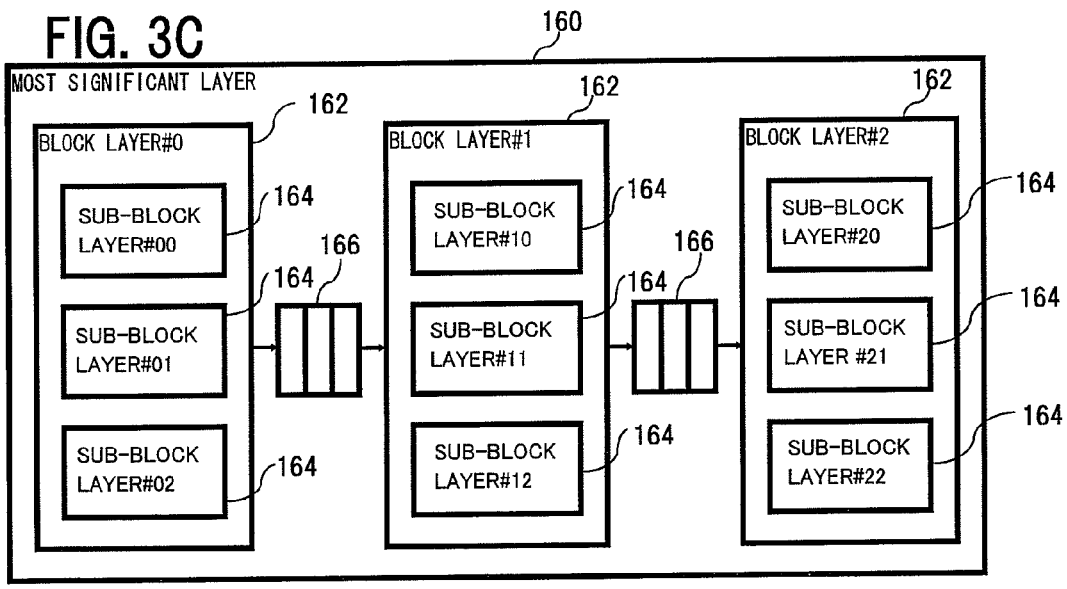
FIG. 3C is a block diagram showing the structure at the behavior level of design data of a normal LSI system which is designed with this embodiment of the LSI design apparatus according to the present invention.

FIGS. 3A, 3B, and 3C show the structure of the behavior level design data of a normal LSI system which is designed with this embodiment of the LSI design apparatus according to the present invention.

As shown in FIGS. 3A through 3C, in the behavior level design data of this normal LSI system, this normal system is described by a hierarchical structured behavior model which has one most significant layer 160, a plurality of block layers 162 included in that most significant layer 160, and a plurality of sub-block layers 164 included in each of that plurality of block layers 162. Each of the sub-block layers 164 is a least significant layer within this hierarchical structured behavior model, in other words is a minimum unit in the behavior model, and its behavior operation is described as including a plurality of variables 167 and processing 168 of those variables 167. Some of the variables 167 in this behavior level design data correspond to registers (for example flip-flops) in the RTL design data.

Each of the block layers 162 is an intermediate layer, and, here, the connection information between the various sub-block layers 164 which are included therein and layers external thereto may be described, for example, in the form of communication channels 166. Each of the block layers 162 corresponds to an intermediate size behavior model in which the plurality of sub-block layers 164 which are included therein is set. As shown in FIG. 3C, the communication channels 166 are elements which perform communication of data from some behavior model (for example, from some sub-block layer 164 or some block layer 162) to some other behavior model (for example, to some other sub-block layer 164 or some other block layer 162) (in FIG. 3C, by way of example, only communication channels 166 between the block layers 162 are shown).

Here, there are two types of these communication channels 166: one for transferring data in the same cycle, and another for transferring data in the next cycle. A communication channel 166 for transferring data in the same cycle corresponds to a simple connection line which connects, in the RTL design data, between the model on the side which sends and the model on the side which receives. And a communication channel 166 for transferring data in the next cycle corresponds, in the RTL (register transfer level) design data, to a set of a re-timing register for delaying the transmission timing present in a sending side model, and a connection line which connects between this re-timing register and a receiving side model.

Figure 4:
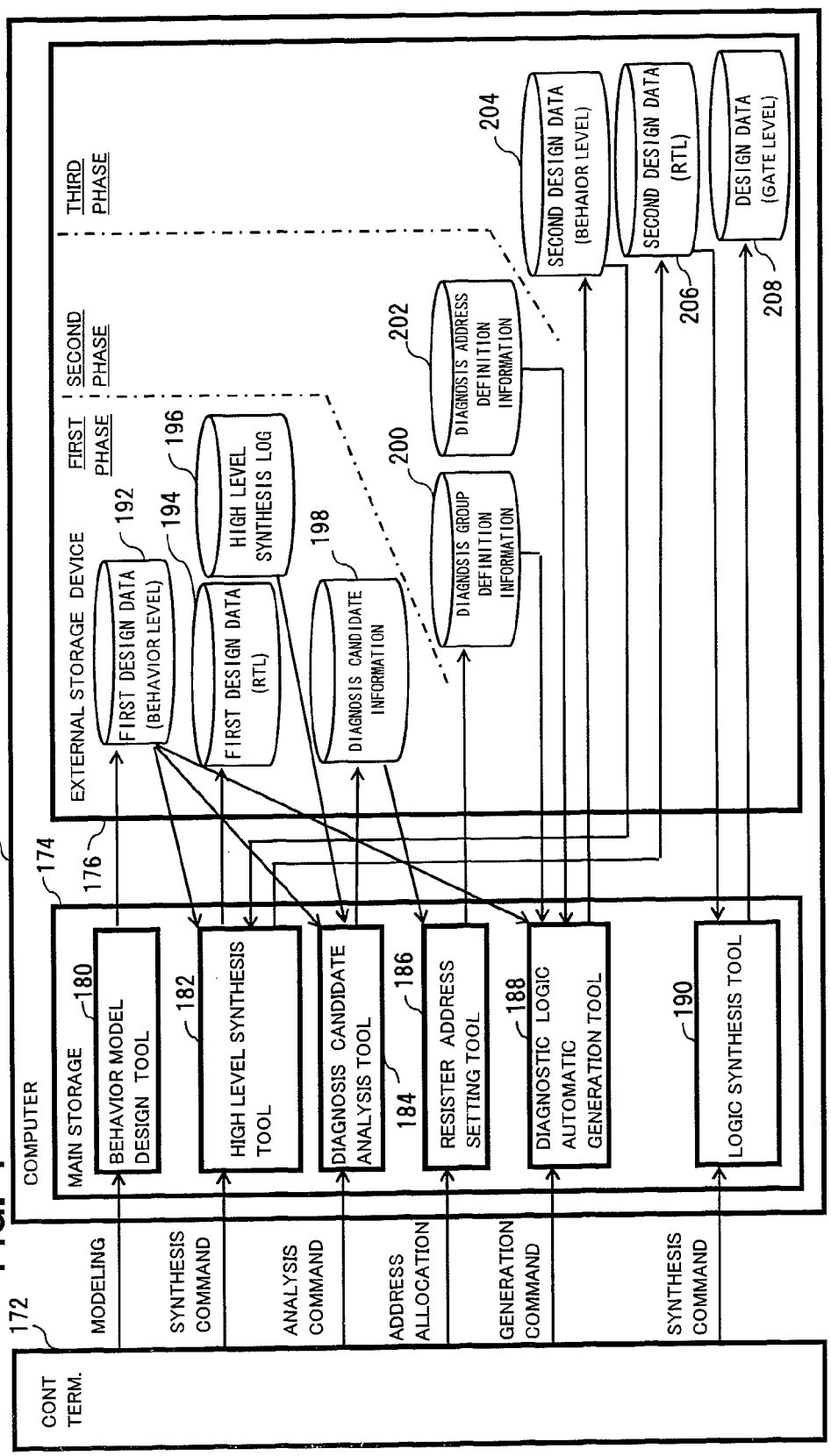
FIG. 4 is a block diagram showing the overall structure of this embodiment of the LSI design apparatus according to the present invention.

FIG. 4 shows the overall structure of this embodiment of the LSI design apparatus according to the present invention.

As shown in FIG. 4, the LSI design apparatus of this embodiment comprises a computer 170, and this computer 170 operates according to various commands from an control terminal 172 which is actuated by a designer. The computer 170 comprises a main storage 174 into which a plurality of computer programs for performing LSI design are loaded, and an external storage device 176 which stores various data and data bases which are inputted and outputted by those computer programs.

In the above described plurality of computer programs, there are included a behavior model design tool 180, a high level synthesis tool 182, a diagnosis candidate analysis tool 184, a register address setting tool 186, a diagnostic logic automatic generation tool 188, and a logic synthesis tool 190. By executing the above described programs 180 through 190, the computer 170 comes to function as a behavior model design device, a high level synthesis device, a diagnosis candidate analysis device, a register address setting device, a diagnostic logic automatic generation device, and a logic synthesis device. While it should be understood that, in this embodiment, each of the above described devices is implemented by a computer program, this is not to be considered as being limitative of the present invention. Accordingly, each of the above described devices could also be implemented by a hardware circuit.

First behavior level design data 192, first RTL design data 194, a high level synthesis log 196, diagnosis candidate information 198, diagnosis group definition information 200, diagnosis address definition information 202, second behavior level design data 204, second RTL design data 206, gate level design data 208, and the like are data bases stored in the external storage device 176.

The process of operation of the LSI design apparatus of this embodiment includes three phases: a first phase, a second phase, and a third phase.

In the first phase, the LSI design apparatus responds to commands from the designer, and creates first behavior level design data 192 in which only the logic of the normal system at the behavior level is described. Thereafter, by performing high level synthesis upon this first behavior level design data 192, first RTL design data 194 in which only the logic of the normal system is described in RTL, and a high level synthesis log 196 which specifies the plurality of hardware registers included in this first RTL design data 194, are created. And, from among the large number of variables which are included in the first behavior level design data 192, the LSI design apparatus extracts as diagnosis candidates the plurality of variables which respectively correspond to the plurality of hardware registers included in the first RTL design data 194, and generates diagnosis candidate information 198 which specifies these diagnosis candidates which have been extracted (i.e. the plurality of variables and the plurality of hardware registers which respectively correspond thereto).

In the second phase, on the basis of the diagnosis candidate information 198, the LSI design apparatus allocates a unique address to each of the diagnosis candidate variables (or registers), and generates diagnosis address definition information 202 which specifies the results of this address allocation. Furthermore, in order to reduce the complication of the problem of arranging the diagnosis candidate registers and the wiring, the LSI design apparatus performs grouping of the plurality of block layers in the normal system, and creates diagnosis group definition information 200 which specifies the results of this grouping.

In the third phase, the LSI design apparatus automatically generates second behavior level design data 204 on the basis of the first behavior level design data 192 which was generated in the first phase (which here describes only the logic of the normal system), and the diagnosis address definition information 202 which was generated in the second phase. This second behavior level design data 204 is data which describes the completed logic of the LSI at the behavior level, in which the logic of the diagnosis system has been added to the logic of the normal system. Thereafter, by performing high level synthesis for a second time upon the second behavior level design data 204, the LSI design apparatus generates second RTL design data 206, in which the above described completed logic is described in RTL. Moreover, by performing logic synthesis upon this second RTL design data 206, the LSI design apparatus generates gate level design data 208 (in other words, a gate level net list) for the above described completed logic.

The operation in concrete terms performed by the above described computer 170 in the above described first through third phases will now be explained.

1. The First Phase

The behavior model design tool 180 receives various commands from the control terminal 172 for modeling the logic of only the normal system in the LSI at the behavior level. And the behavior model design tool 180 generates the first behavior level design data 192 in response to those commands. In this first behavior level design data 192, the logic of the above described normal system, only, is described as a behavior model of the layered construction shown in the examples of FIGS. 3A through 3C. Each of the plurality of sub-block layers included in the first behavior level design data 192 is a minimum unit in the behavior model, in which a plurality of variables and processes upon those variables are included. A per se known program may be employed as this behavior model design tool 180.

Thereafter, the high level synthesis tool 182 responds to the high level synthesis command from the control terminal 172, and performs the following operations.

That is, the high level synthesis tool 182 inputs the first behavior level design data 192, and generates the first RTL design data 194 for the above described normal system on the basis of the first behavior level design data 192. This first RTL design data 194 includes a plurality of hardware registers, and these hardware registers respectively correspond to the plurality of variables which are included in the first behavior level design data 192. When generating the first RTL design data 194, the high level synthesis tool 182 also generates the high level synthesis log 196. This high level synthesis log 196 specifies the concrete attributes (for example, the block layer names, the sub-block layer names, the register names, and so on) of the plurality of hardware registers in the first RTL design data 194. A per se known program may be employed as this high level synthesis tool 182.

Thereafter, the diagnosis candidate analysis tool 184 responds to a diagnosis candidate analysis command from the control terminal 172, and performs the following operations.

That is, the diagnosis candidate analysis tool 184 inputs the first behavior level design data 192 and the high level synthesis log 196, specifies the plurality of block layers included in the first behavior level design data 192 on the basis of the first behavior level design data 192, specifies the plurality of sub-block layers which are included in these block layers, and specifies the plurality of variables which are included in these sub-block layers. And, from among the plurality of variables which have been specified as described above, on the basis of the high level synthesis log 196, the diagnosis candidate analysis tool 184 detects the plurality of variables (hereinafter termed the "diagnosis candidate variables") which respectively correspond to the plurality of hardware registers (hereinafter termed the "diagnosis candidate registers") in the first RTL design data 194.

Moreover, the diagnosis candidate analysis tool 184 specifies the sub-block layers (hereinafter termed the "diagnosis candidate sub-block layers") and the block layers (hereinafter termed the "diagnosis candidate block layers") which are included in each of the above described plurality of diagnosis candidate variables which have been detected. And the diagnosis candidate analysis tool 184 generates the diagnosis candidate information 198.

This diagnosis candidate information 198 specifies the plurality of diagnosis candidate variables and the plurality of diagnosis candidate registers which correspond to one another. Moreover, the diagnosis candidate information 198 also specifies the diagnosis candidate block layers and the diagnosis candidate sub-block layers in which the diagnosis candidate variables are included (in other words, in which the diagnosis candidate variables are included).

2. The Second Phase

Thereafter, the register address setting tool 186 responds to a register address allocation command from the control terminal 172, and performs the following operations.

In other words, the register address setting tool 186 inputs the diagnosis candidate information 198, and maps the above described plurality of diagnosis candidate registers (in other words, the diagnosis candidate variables) which are specified in the diagnosis candidate information 198 onto the software address space which is used by the MPU (for example, by the MPU 102 shown in FIG. 1, or by the MPU 150 shown in FIG. 2) (or which is used by the diagnosis program). In other words, the register address setting tool 186 allocates a unique address position in the above described software address space to each of the above described plurality of diagnosis candidate registers. And the register address setting tool 186 generates the diagnosis address definition information 202. This diagnosis address definition information 202 specifies the address positions in the above described software address space which are allocated to the above described plurality of diagnosis candidate registers.

Furthermore, on the basis of the diagnosis candidate information 198, the register address setting tool 186 groups the above described plurality of diagnosis candidate block layers into a plurality of diagnosis groups, the number of which is smaller than the number of those diagnosis candidate block layers (in other words, consolidates two or more diagnosis candidate block layers into one diagnosis group). And the register address setting tool 186 generates the diagnosis group definition information 200. This diagnosis group definition information 200 specifies the above described plurality of diagnosis groups, and the two or more diagnosis candidate block layers which are included in each of these diagnosis groups.

3. The Third Phase

Thereafter, the diagnostic logic automatic generation tool 188 responds to a diagnostic logic automatic generation command from the control terminal 172, and performs the following operations.

In other words, the diagnostic logic automatic generation tool 188 inputs the first behavior level design data 192 and the diagnosis address definition information 202, and generates the second behavior level design data 204 on the basis of the first behavior level design data 192 and the diagnosis address definition information 202. This second behavior level design data 204 is data which describes at the behavior level the completed logic, in which the logic of the above described diagnosis system is added to the logic of the above described normal system.

Thereafter, the high level synthesis tool 182 responds for a second time to a high level synthesis command from the control terminal 172, and performs the following operations.

In other words, the high level synthesis tool 182 inputs the second behavior level design data 204, and generates the second RTL design data 206 on the basis of this second behavior level design data 204. This second RTL design data 206 is data which describes the above described completed logic by RTL.

Thereafter, the logic synthesis tool 190 responds for a second time to a logic synthesis command from the control terminal 172, and performs the following operations.

In other words, the logic synthesis tool 190 inputs the second RTL design data 206, and generates the gate level design data 208 on the basis of this second RTL design data 206. The gate level design data 208 is data which describes the above described completed logic at the gate level (in other words, in the form of a circuit diagram which shows the connections of the plurality of IC cells), and generally is a so called gate level net list.

Figure 5:
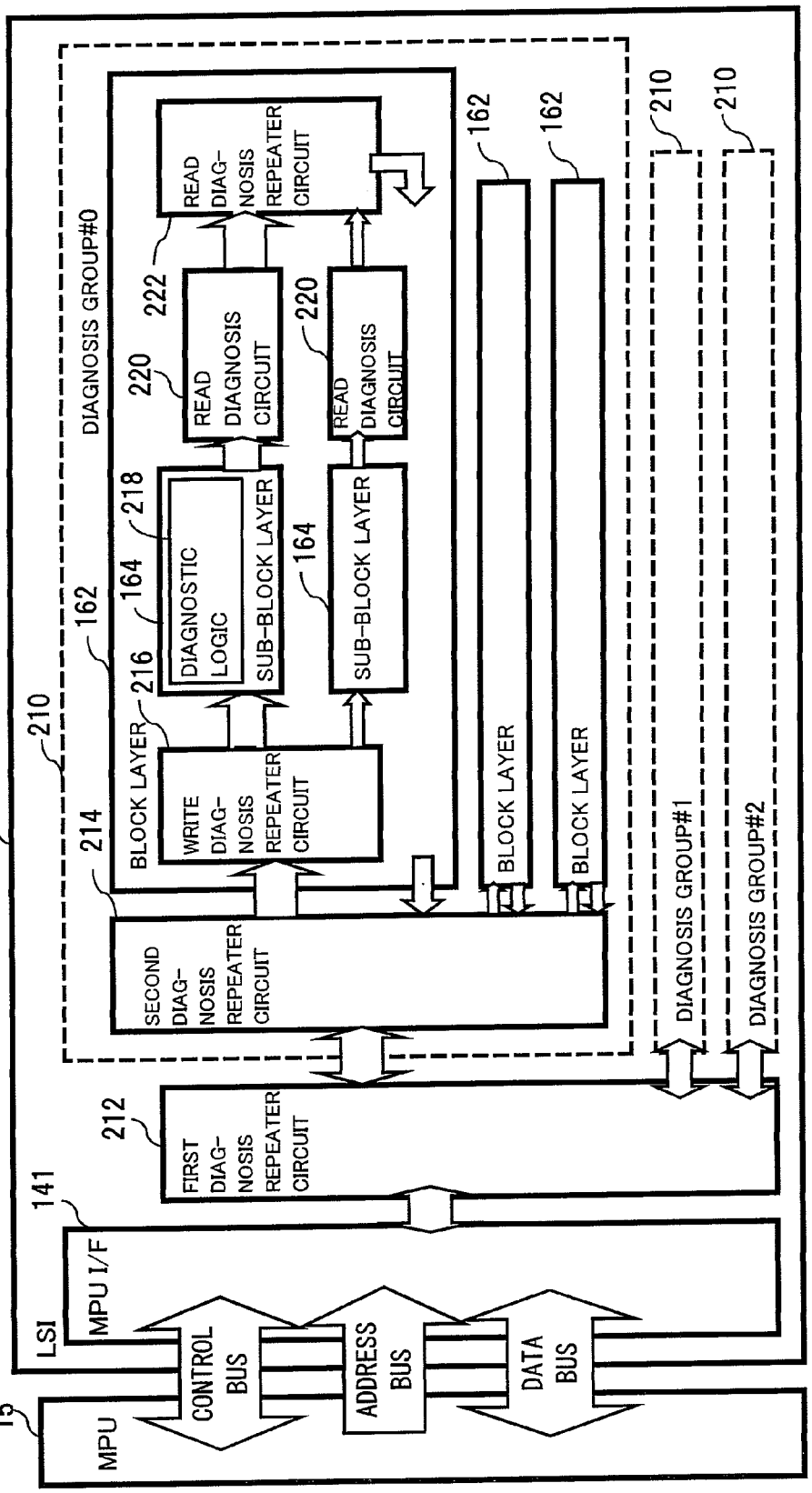
FIG. 5 is a block diagram showing the overall structure of an LSI which is designed with the LSI design apparatus shown in FIG. 4.

FIG. 5 shows the overall structure of an LSI which is designed with this embodiment of the LSI design apparatus according to the present invention.

The LSI 140 shown in FIG. 5 includes both a normal system and a diagnosis system. The normal system comprises an MPU interface circuit 141, a plurality of block layers 162, and a plurality of sub-block layers 164 included in each of these block layers 162. Although this feature is not shown in the figure, each of these sub-block layers 164 comprises a plurality of registers (for example flip-flops) and a plurality of combination circuits (for example logic gates such as AND gates, OR gates, adders, subtracters, and so on, and combinations thereof and the like). The plurality of block layers 162 are grouped into a plurality of virtual diagnosis groups 210, the number of which is smaller than the number of block layers 162. Thus, one of these diagnosis groups 210 includes two or more of the block layers 162.

The diagnosis system includes the following six types of circuits 212 through 222.

(1) The First Diagnosis Repeater Circuit 212 Via the MPU interface circuit 141 from the MPU 150 (i.e. the diagnosis program), a first diagnosis repeater circuit 212 receives diagnosis mode setting data (refer to FIG. 2) for changing over the operation mode of the sub-block layer 164 which has been selected for diagnosis from the normal mode to the diagnosis mode, and input test data (refer to FIG. 2) to be written into a variable to be diagnosed (i.e. into a register to be diagnosed) in the sub-block layer 164 to be diagnosed. And this first diagnosis repeater circuit 212 returns output test data (refer to FIG. 2) from the variable to be diagnosed (i.e. from the register to be diagnosed) to the MPU 150 (i.e. the diagnosis program) via the MPU interface circuit 141.

(2) The Second Diagnosis Repeater Circuit 214 A second diagnosis repeater circuit 214 is provided for each of the diagnosis groups 210, and receives the diagnosis mode setting data and the input test data from the first diagnosis repeater circuit 212 and sends this diagnosis mode setting data and input test data to those addresses within the plurality of block layers 162 in that diagnosis group 210 which have been designated. Moreover, this second diagnosis repeater circuit 214 receives the output test data from those addresses within the plurality of block layers 162 in that diagnosis group 210 which have been designated, and returns this output test data to the first diagnosis repeater circuit 212.

(3) The Write Diagnosis Circuit 216

An write diagnosis circuit 216 is provided within each block layer 162 in each of the diagnosis groups 210, and receives the diagnosis mode setting data and the input test data from the second diagnosis repeater circuit 214 of that diagnosis group 210 and sends this diagnosis mode setting data and input test data to those addresses within the plurality of sub-block layers 164 in that block layer 162 which have been designated.

(4) The Internal Diagnosis Circuit 218

An internal diagnosis circuit 218 is provided within each of the sub-block layers 164 of each of the block layers 162. This internal diagnosis circuit 218 receives the diagnosis mode setting data from the write diagnosis circuit 216 of that block layer 162, and changes over the operation mode (i.e. the state) of that sub-block layer 164 from the normal mode to the diagnosis mode. Moreover, when each of the sub-block layers 164 is in its diagnosis mode, its internal diagnosis circuit 218 receives the input test data from the write diagnosis circuit 216 of that block layer 162, inputs this input test data into the variables to be diagnosed (i.e. into the registers to be diagnosed) whose addresses have been designated within this sub-block layer 164, and receives the output test data from these variables to be diagnosed (i.e. from these registers to be diagnosed).

(5) The Read Diagnosis Circuit 220

A read diagnosis circuit 220 is provided for each of the sub-block layers 164 of each of the block layers 162, and receives the output test data from the internal diagnosis circuit 218 within this sub-block layer 164.

(6) The Read Diagnosis Circuit 222

An read diagnosis circuit 222 is provide for each of the block layers 162 within each diagnosis group 210, and consists of one pair of write diagnosis circuits 216 within that block layer 162. This read diagnosis circuit 222 receives the output test data from the plurality of read diagnosis circuits 220 within this block layer 162, and returns this output test data to the second intermediate diagnosis group 210 of that diagnosis group 210.

Figure 6:
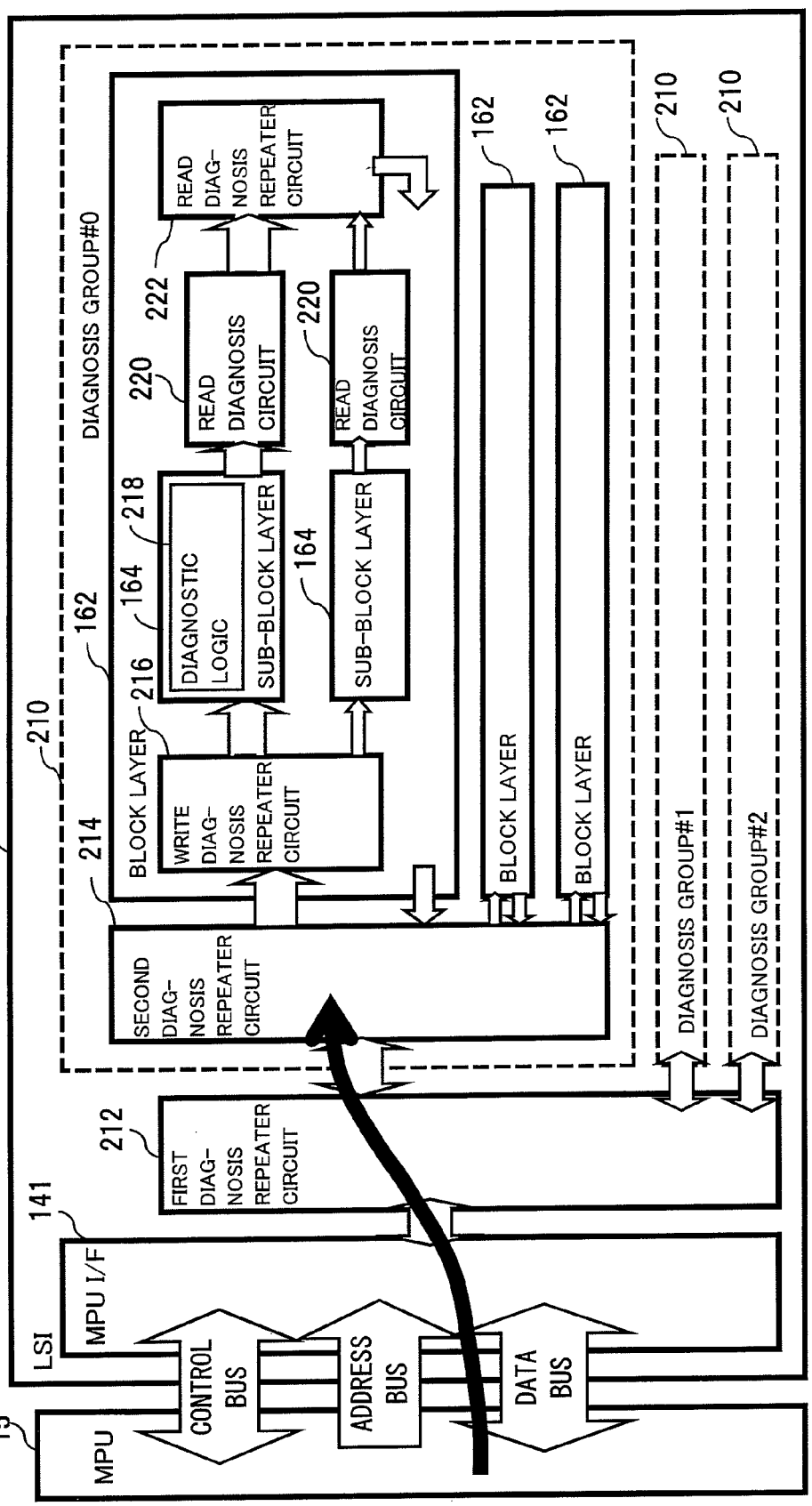
FIG. 6 is a block diagram for explanation of a step of diagnosis mode setting in the process of micro diagnosis of the LSI shown in FIG. 5.
Figure 7:
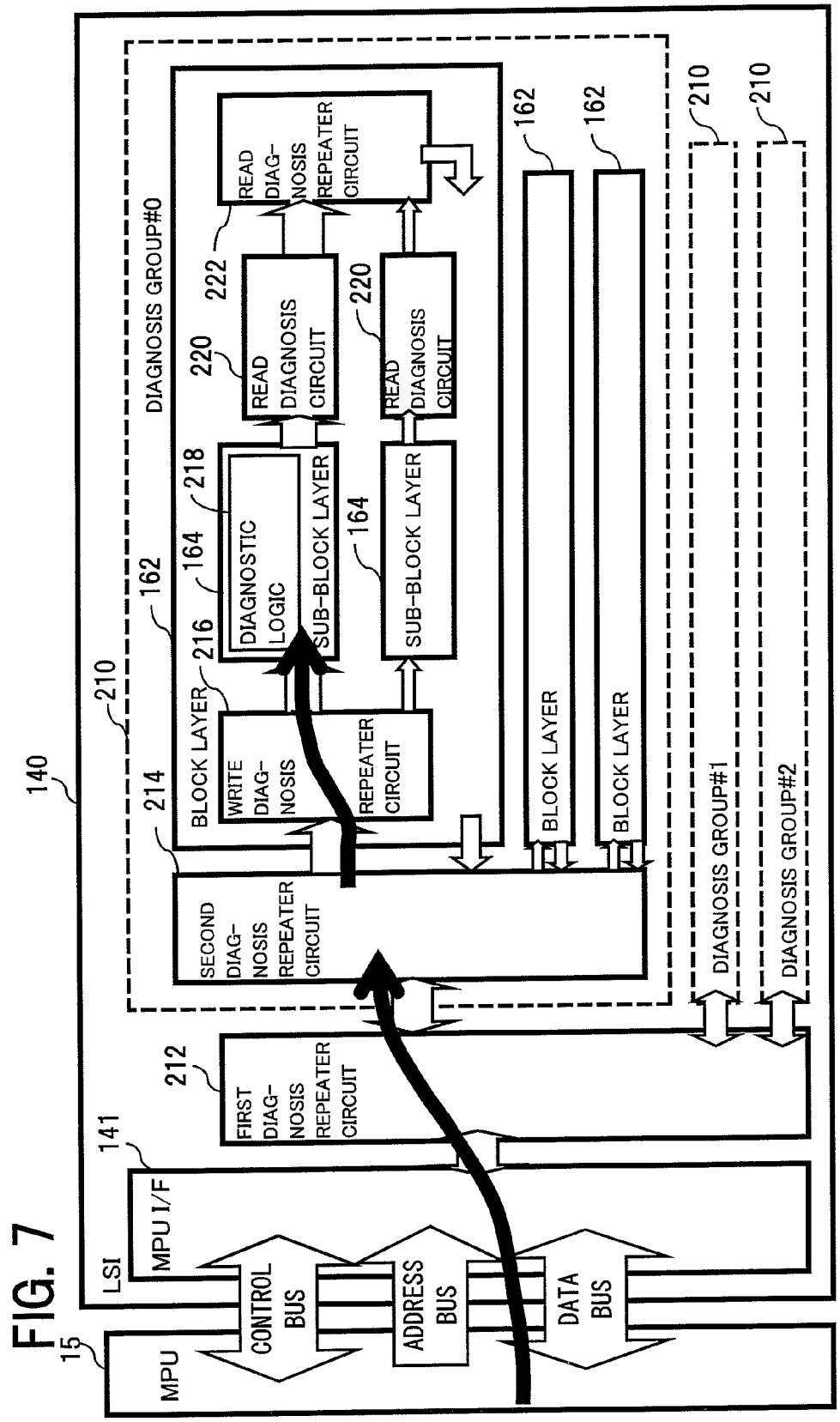
FIG. 7 is a block diagram for explanation of a step of writing input test data in the process of micro diagnosis of the LSI shown in FIG. 5.
Figure 8:
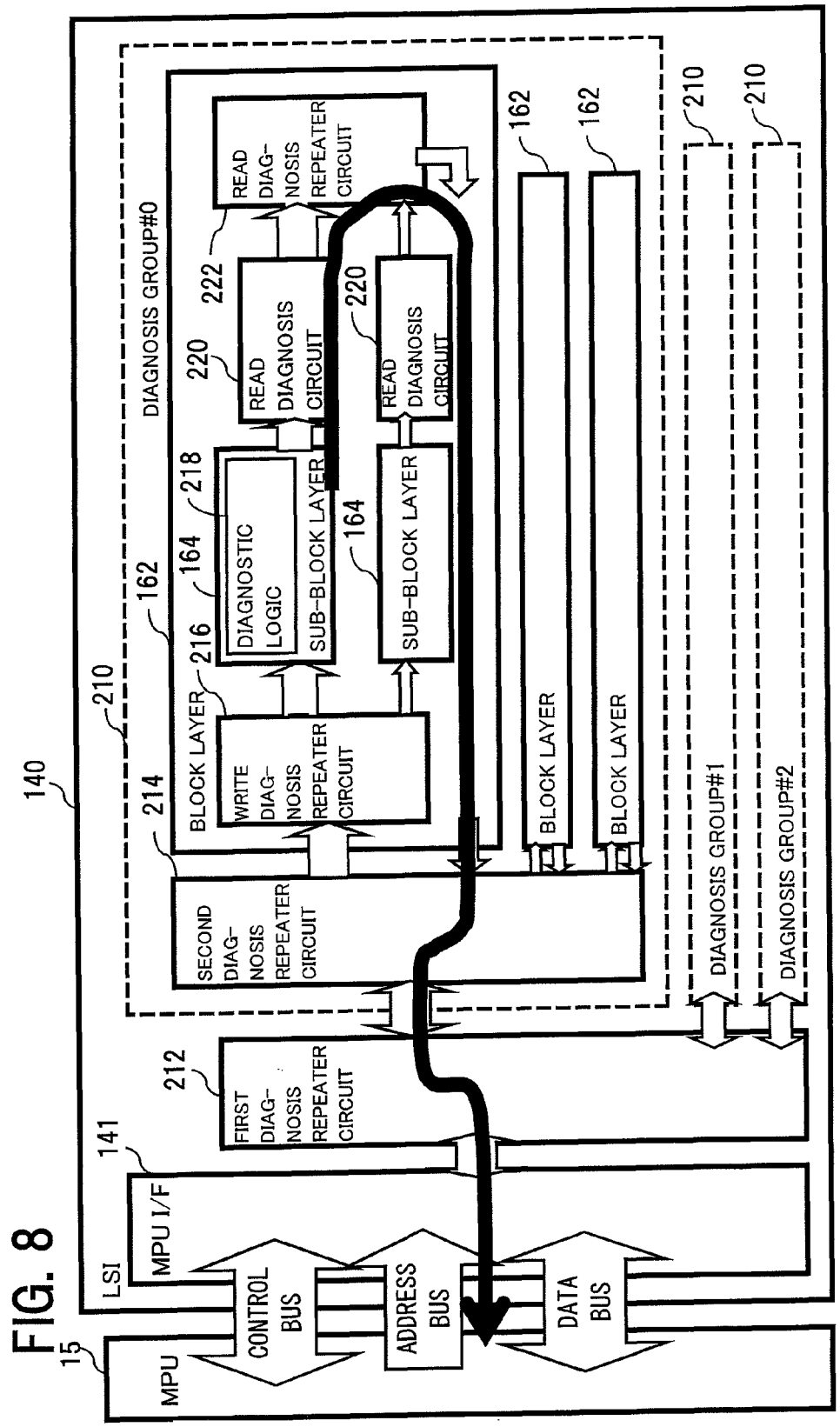
FIG. 8 is a block diagram for explanation of a step of reading output test data in the process of micro diagnosis of the LSI shown in FIG. 5.

The micro diagnosis of the LSI 140 shown in FIG. 5 is performed by the steps shown in FIGS. 6 through 8.

(1) Diagnosis Mode Setting

As shown by the arrow sign 230 in FIG. 6, the MPU 150 (i.e. the diagnosis program) sets the diagnosis mode setting data and the input test data into the second diagnosis repeater circuit 214. In other words, the MPU 150 sequentially designates the addresses of the mode setting register data 146 within the second diagnosis repeater circuit 214 (see FIG. 2) and of the test data register 148 (see FIG. 2), and sequentially commands the writing of the diagnosis mode setting data into the mode setting register data 146 and the writing of the input test data into the test data register 148. And, as shown by the arrow sign 230, the diagnosis mode setting data and the input test data are written, respectively, into the mode setting register data 146 within the second diagnosis repeater circuit 214 and the test data register 148 via the MPU interface circuit 141 and the first diagnosis repeater circuit 212.

(2) Writing the Input Test Data

As shown by the arrow sign 232 in FIG. 7, the MPU 150 writes the input test data into the register to be diagnosed (i.e. into the variable to be diagnosed). In other words, as shown by the arrow sign 232, the MPU 150 (i.e. the diagnosis program) issues a command for writing which designates the address of the register to be diagnosed 144 (see FIG. 2) within the desired sub-block layer 164. When this is done, as shown by the arrow sign 234, the input test data within the test data register 148 (see FIG. 2) in the second diagnosis repeater circuit 214 are inputted to the sub-block layer 164 in which the register to be diagnosed is present via the write diagnosis circuit 216. Due to this, the input test data is written into the register to be diagnosed 144 (see FIG. 2).

(3) Reading the Output Test Data

As shown by the arrow sign 236 in FIG. 8, the MPU 150 (i.e. the diagnosis program) reads the output test data from the register to be diagnosed 144 (see FIG. 2). In other words, the MPU 150 (i.e. the diagnosis program) designates the address of the register to be diagnosed 144 (see FIG. 2), and issues a command for reading. When this is done, as shown by the arrow sign 236, the data in the register to be diagnosed 144 (see FIG. 2) (i.e. the output test data) is read into the MPU 150 via the internal diagnosis circuit 218, the read diagnosis circuit 220, the read diagnosis circuit 222, the second diagnosis repeater circuit 214, and the first diagnosis repeater circuit 212. And the MPU 150 decides whether or not the register to be diagnosed is normal by comparing the output test data which has been read with predetermined anticipated value data (for example with the same data as the input test data).

Figure 9:
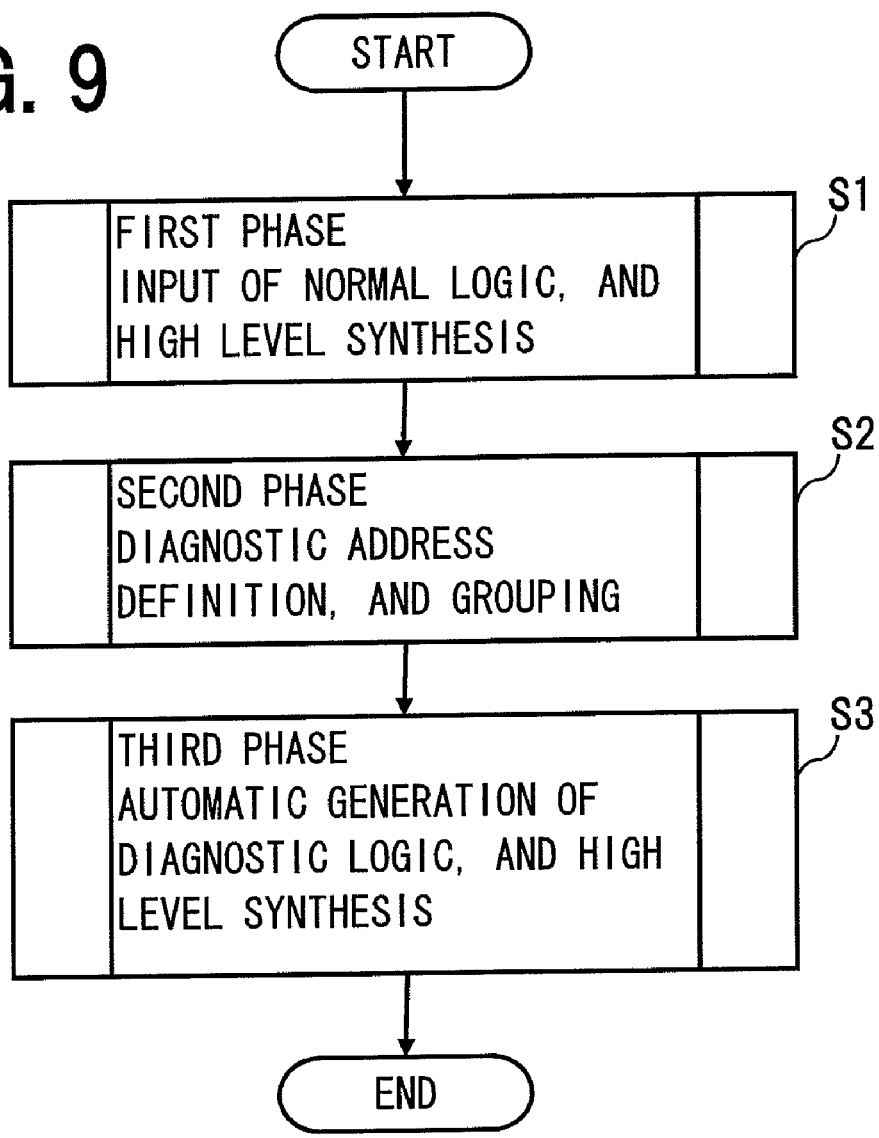
FIG. 9 is a flow chart showing the overall processing flow performed by the LSI design apparatus of this embodiment shown in FIG. 4.

FIG. 9 shows the flow of the overall processing performed by the LSI design apparatus according to this embodiment shown in FIG. 4.

As shown in FIG. 9, in a step S1, the first phase described above is performed; in other words the input of the logic of the normal system and the high level synthesis are performed. And in a step S2, the second phase described above is performed; in other words the definition of the diagnosis addresses and their grouping are performed. are performed. And in a step S3, the third phase described above is performed; in other words the automatic generation of the diagnostic logic and the re-doing of the high level synthesis are performed.

Figure 10:
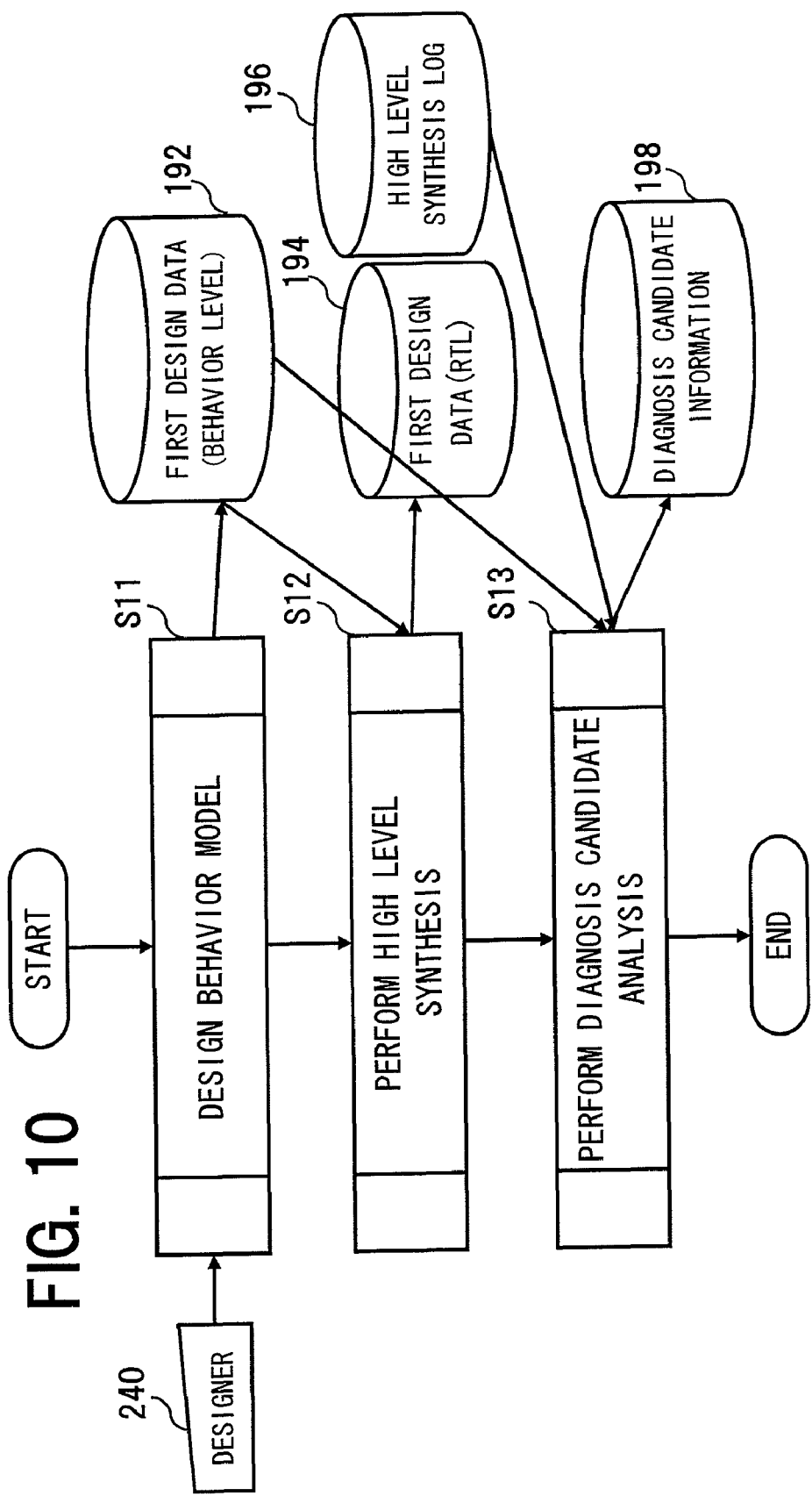
FIG. 10 is a flow chart showing the flow of a first phase of processing.

FIG. 10 shows the flow of the processing for the first phase.

As shown in FIG. 10, in a step S11, the designer 240 inputs the logic for the normal LSI system to the behavior model design tool 180. And, on the basis of this input from the designer, the behavior model design tool 180 generates the first behavior level design data 192, in which the logic of the normal system is described at the behavior level.

Then in a step S12 the high level synthesis tool 182 converts the first behavior level design data 192 to the first RTL design data 194, in which the logic of the normal system is described with RTL. At this time, the high level synthesis tool 182 generates the high level synthesis log 196 which specifies the attribute values (for example, the block layer names, the sub-block layer names, the register names and the like) of a plurality of hardware registers which are included in the first RTL design data 194.

Finally, in a step S13, the diagnosis candidate analysis tool 184 generates the diagnosis candidate information 198 on the basis of the first behavior level design data 192 and the high level synthesis log 196. This diagnosis candidate information 198 specifies a plurality of hardware registers (i.e. diagnosis candidate registers) in the first RTL design data 194 and a plurality of variables (i.e. diagnosis candidate variables) in the first behavior level design data 192 which respectively correspond to those diagnosis candidate registers. Moreover, this diagnosis candidate information 198 specifies which block layers (i.e. which diagnosis candidate block layers) and which sub-block layers (i.e. which diagnosis candidate sub-block layers) the diagnosis candidate variables and the diagnosis candidate registers are included in.

Figure 11:
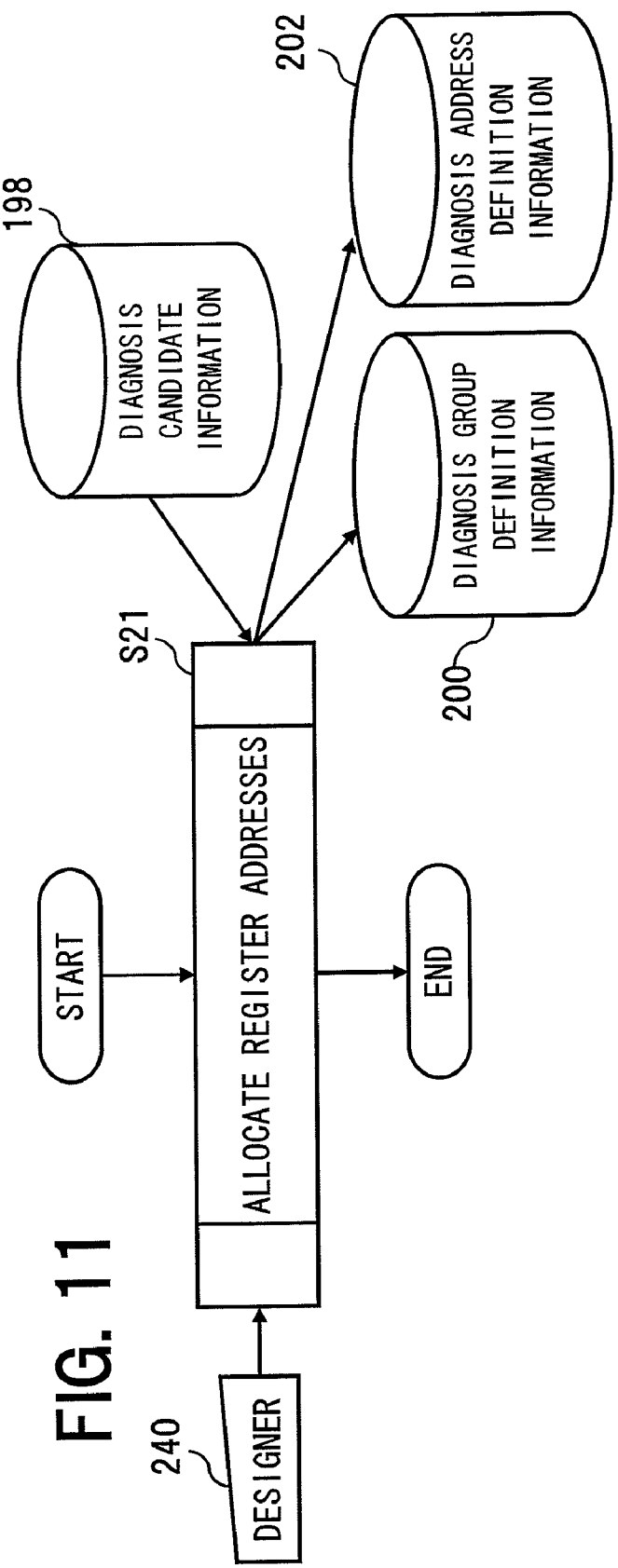
FIG. 11 is a flow chart showing the flow of a second phase of processing.

FIG. 11 shows the flow of the processing for the second phase.

As shown in FIG. 11, in a step S21, on the basis of the diagnosis candidate information 198, the register address setting tool 186 displays to the designer 240 a diagnosis group setting screen for grouping the above described plurality of diagnosis candidate block layers, and an address setting screen for mapping the above described diagnosis candidate registers (or diagnosis candidate variables) to the address space as seen from the diagnosis program (i.e. to the software address space).

While looking at this diagnosis group setting screen, the designer 240 inputs to the register address setting tool 186 grouping commands which specify which diagnosis candidate block layers are to be included in which diagnosis groups. And, according to the above described grouping commands from the designer 240, the register address setting tool 186 generates the diagnosis group definition information 200, in which it is specified which diagnosis candidate block layers are included in which diagnosis groups.

Moreover, while looking at the above described address setting allocation screen, the designer 240 inputs to the register address setting tool 186 address setting commands which specify which address positions are allocated to which diagnosis candidate registers (or diagnosis candidate variables). And, according to the above described address setting commands from the designer 240, the register address setting tool 186 generates the diagnosis address definition information 202, in which it is specified which address positions are allocated to which diagnosis candidate registers (or diagnosis candidate variables).

Figure 12:
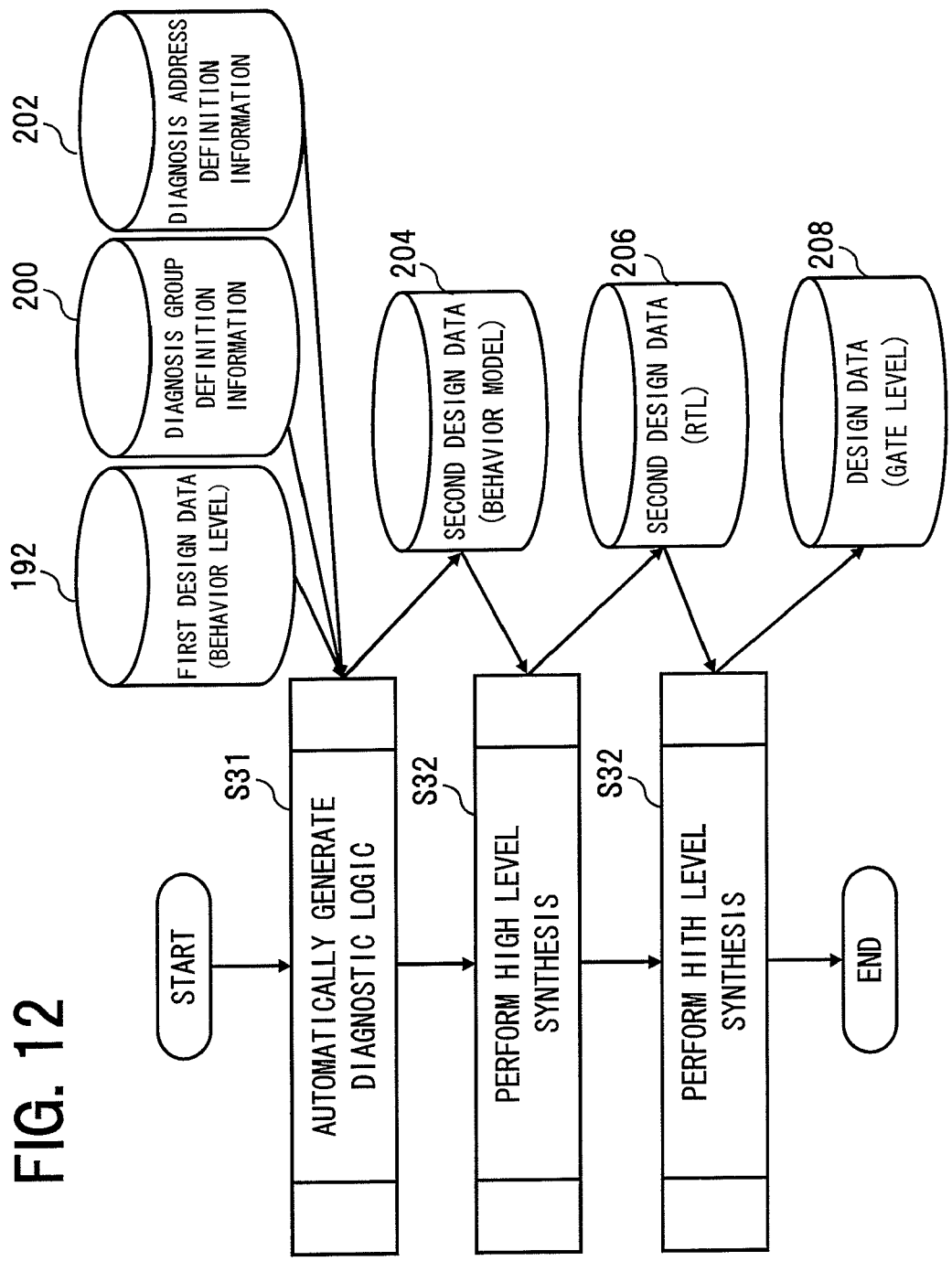
FIG. 12 is a flow chart showing the flow of a third phase of processing.

FIG. 12 shows the flow of the processing for the third phase.

As shown in FIG. 12, in a step S31, on the basis of the first behavior level design data 192 (which here is only describing the logic of the normal system) and the diagnosis address definition information 202, the diagnostic logic automatic generation tool 188 generates the second behavior level design data 204 which describes the completed logic, in which the logic of the diagnosis system is added to the logic of the normal system.

And in a step S32, the high level synthesis tool 182 converts this second behavior level design data 204 into the second RTL design data 206. Finally in a step S33 the logic synthesis tool 190 inputs this second RTL design data 206, and converts the second RTL design data 206 into the gate level design data 208.

Figure 13:
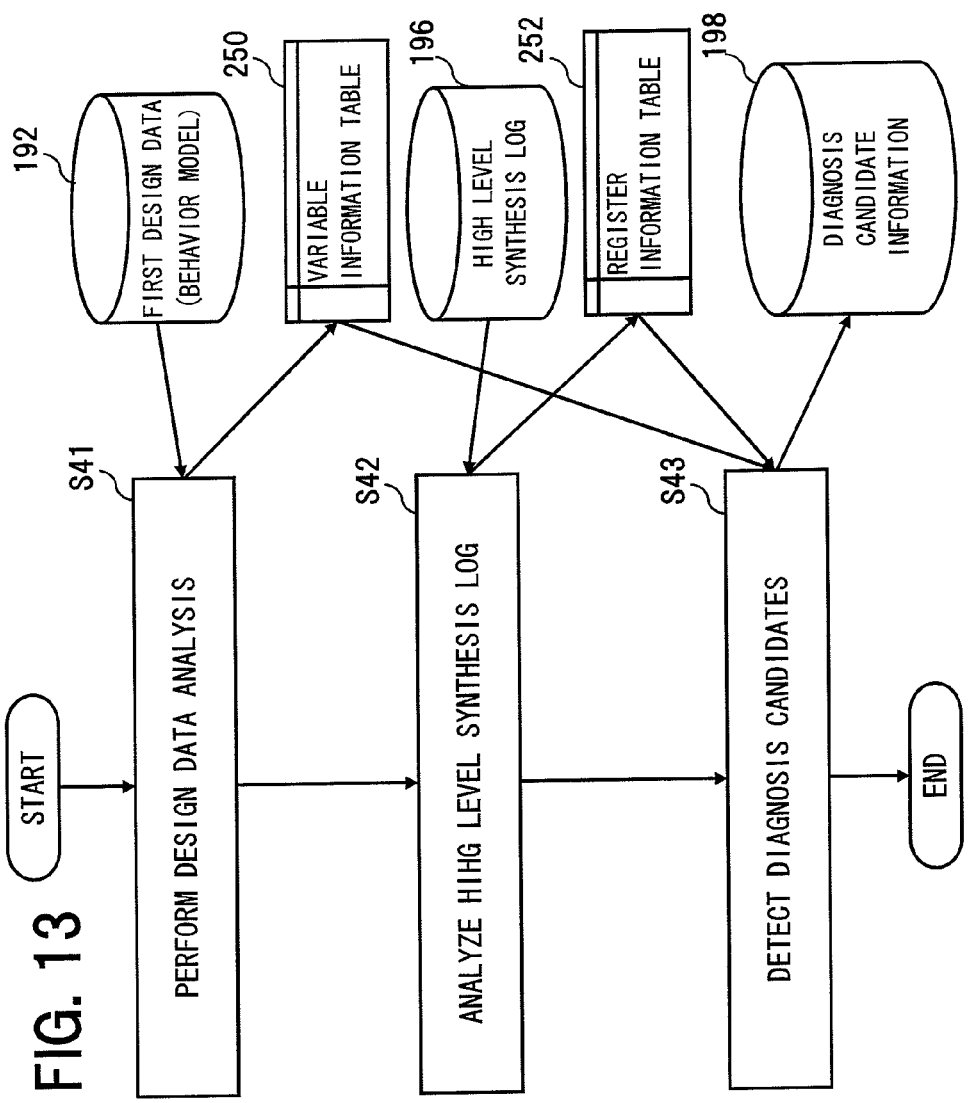
FIG. 13 is a flow chart showing the flow of processing in a step S13 shown in FIG. 10 (processing which is performed by a diagnosis candidate analysis tool 184).

FIG. 13 shows the flow of processing in the step S13 shown in FIG. 10 (i.e. of the processing which is performed by the diagnosis candidate analysis tool 184).

In a step S41 of FIG. 13, the first behavior level design data 192 is analyzed, and layer information which specifies a layer structure made up from a plurality of block layers and sub-block layers such as those shown by way of example in FIGS. 3A through 3C, and variable information which specifies a plurality of variables which are included in the various sub-block layers, is extracted. And, on the basis of this layer information and variable information, a variable information table 250 which specifies the detailed information for each variable is generated.

As shown by way of example in FIG. 14A, in this variable information table 250, as detailed information for each variable, there may be described, for example:

Block layer: the name of the block layer in which this variable is included;
Sub-block layer name: the name of the sub-block layer in which this variable is included;
Variable name: the name of this variable;
Bit length: the bit length of this variable;
Variable attributes: the role of this variable;
and the like.

Here, the "variable attributes" for each variable consists of a plurality of values which specify the role of that variable, such as, for example:

ST: a state management variable;
LV: a local variable;
CH: a channel variable for communication;
and the like.

Here, the "state management variable" (ST) specifies the state of the sub-block layer (the minimum unit in the behavior model) to which that variable belongs as a FSM (Finite State Machine). The "local variable" (LV) is a variable which is only referred to by the interior of the sub-block layer to which that variable belongs. The "variable for communication channel" functions as a communication channel for outputting data of other variables within the sub-layer to which that variable belongs to the exterior of that sub-block layer.

In the step S42 of FIG. 13, the high level synthesis log 196 is analyzed, and register information is extracted which specifies detailed information for a plurality of hardware registers which are included in the first RTL design data. And, on the basis of this register information, a register information table 252 is generated which specifies the detailed information for these hardware registers.

As shown by way of example in FIG. 14B, in this register information table 252, as detailed information for each register, there may be described, for example:

Block layer: the name of the block layer in which this register is included;
Sub-block layer: the name of the sub-block layer in which this register is included;
Register name: the name of this register;
and the like.

In a step S43 of FIG. 13, the variable information table 250 and the register information table 252 are mutually checked against one another, and thereby the variables which have been converted into registers by the high level synthesis are extracted as diagnosis candidate variables. For example, if the block layer names and the sub-block layer names for some variable in the variable information table 250 and some register in the register information table 252 agree with one another, and moreover this variable name and this register name also agree with one another, then it may be decided that this variable has been converted into this register by the high level synthesis. Accordingly, this variable is extracted as a diagnosis candidate variable. And the diagnosis candidate information 198 is generated, which specifies the detailed information for the various diagnosis candidate variables which have thus been extracted.

As shown by way of example in FIG. 14C, in this diagnosis candidate information 198, as detailed information for each diagnosis candidate variable, there may be described, for example:

Block layer: the name of the block layer in which this variable is included (i.e. the diagnosis candidate block layer);
Sub-block layer name: the name of the sub-block layer in which this diagnosis candidate variable is included;
Variable name: the name of this diagnosis candidate variable;
Register name: the name of the register which corresponds to this diagnosis candidate variable (the diagnosis candidate register);
Bit length: the bit length of this diagnosis candidate variable;
Variable attributes: the role of this diagnosis candidate variable;
and the like.

FIG. 15 shows the flow of processing in the step S21 shown in FIG. 11 (i.e. of the processing which is performed by the register address setting tool 186).

In a step S51 of FIG. 15, the diagnosis candidate information 198 (refer to FIG. 14C) is read in. And in a step S52 a selection is made as to whether or not automatic setting is to be performed, and, according to this selection, either manual setting is performed in the step S53, or automatic setting is performed in the step S54.

In the manual setting of the step S54, the previously described group setting screen and the register address setting screen based upon the diagnosis candidate information 198 are displayed to the designer 24, and, while looking at those screens, the designer 240 inputs group setting commands and register address setting commands. And the register address setting tool 186 generates the diagnosis group table 260, the SW (software) register management table 262, and the HW (hardware) register management table 264 according to these group setting commands and register address setting commands from the designer 240, on the basis of the diagnosis candidate information 198.

In the automatic allocation of the step S54, all data of the diagnosis candidate information 198 is analyzed automatically, and the software (SW) register management table 262 and the hardware (HW) register management table 264 are automatically generated on the basis of the results of this analysis.

As shown by way of example in FIG. 16A, in this diagnosis group table 260, as detailed information for each of the plurality of diagnosis groups which are manually or automatically set, there may be described, for example:

Diagnosis group ID: a unique identification value which is allocated to this diagnosis group;

Higher-order address: a higher-order address in the software address space which is allocated to this diagnosis group;

and the like.

As shown in the example of FIG. 16B, in the SW register management table 262, there is described detailed information for each of the plurality of SW registers which have been set manually or automatically. Here, the SW registers are registers which are present in the software address space, which are directly seen from the diagnosis program, and which can be directly actuated from the diagnosis program. The bit size of each of the SW registers agrees with the bit size of the data inputted and outputted by the diagnosis program (i.e. by the MPU 150), being for example 32 bits, and normally this does not agree with the bit size of the hardware (HW) registers which are described in the RTL design data. The setting of the register addresses which is performed in the step S53 or S54 is the task of mapping (allocating) each of the HW registers to some bit position range of one of the SW registers. Once this allocation has been done, then the diagnosis program (i.e. the MPU 150) is enabled to designate an address for each HW register by designating the address of this SW register and the position within it.

As shown by way of example in FIG. 16B, as detailed information for each of the SW registers which are described in this SW register management table 262, there may be included, for example:

SW register name: the name of this SW register when seen from the MPU 150;

SW register attributes: the role of this SW register;

Lower-order address: the lower-order address which is allocated to this SW register when seen from the MPU 150;

Diagnosis group ID: the diagnosis group ID of the diagnosis group to which this SW register belongs;

and the like.

Here in "SW register attributes", for example, there may be included:

MODE: the mode setting register which is used in diagnosis mode setting (refer to the reference number 146 in FIG. 2)

TEST: the test data register which is used in input test data setting (refer to the reference number 148 in FIG. 2);

DIAG: the register which is allotted to the diagnosis candidate register in the normal system;

and the like.

As shown by way of example in FIG. 16C, in the HW register management table 264, there is described detailed information for the HW registers (i.e. the diagnosis candidate registers) which are described in the first RTL design data 194, for example:

HW register name: the register name which is defined by the first RTL design data 194 (in other words, the name of the corresponding variable named by the designer 240 when it generated the first behavior design data 192).

SW register name: the name of the SW register to which this HW register is allocated;

Start bit position (in this SW register, the start bit position of the bit position range to which this HW register is mapped), end bit position (in this SW register, the end bit position in the bit position range to which this HW register is mapped), block layer name (the name of the block layer to which this HW register belongs), sub-block layer name (the name of the sub-block layer to which this HW register belongs), and variable attributes (the variable attributes of the diagnosis candidate variable which is defined as corresponding in the first behavior level design data);

and the like are also included.

Here in "variable attributes", as already explained, there are included:

ST: a state management variable;

LV: a local variable;

CH: a channel variable for communication;

NONE: no variable attributes (the above described mode setting register (refer to the reference number 146 in FIG. 2) and test data register (refer to the reference number 148 in FIG. 2));

and the like.

FIGS. 17 and 18 show examples of the group setting screen 270 and the register address setting screen 272 which are displayed to the designer 240 in the step S53 of FIG. 15.

As shown by way of example in FIG. 17, on the group setting screen 270, detailed information for each diagnosis group which has been set by the designer 240 is described, for example:

Diagnosis group ID: a unique identification value for this diagnosis group;

Higher-order address: the higher-order address in the address region in the software address space in which this diagnosis group is included;

Lower-order address: the lower-order address of the start address position in the software address space of each of the plurality of SW registers which belong to this diagnosis group;

SW register name: the names of the SW registers which belong to this diagnosis group;

SW register attributes: the SW register attributes of the SW registers which belong to this diagnosis group;

and the like.

Two or more block layers belong to one diagnosis group. Accordingly, the plurality of HW registers (i.e. diagnosis candidate registers) which are included in these two or more block layers come respectively to be mapped to a plurality of SW registers which are included in this one diagnosis group.

As shown by way of example in FIG. 18, on the register address setting screen 272, detailed information for each diagnosis group which has been set by the designer 240 is shown. In other words, on this register address setting screen 272, as detailed information for register address setting, there is described:

Diagnosis group ID: an identification value for the diagnosis group to which this SW register belongs;

SW register name: the name of this SW register;

SW register attributes: the SW register attributes of this SW register;

Block layer name: the name of the block layer to which this SW register belongs;

Sub-block layer name: the name of the sub-block layer to which this SW register belongs;

BYTE: The identification number of each of the plurality of bytes (for example, four bytes) possessed by this SW register;

BIT: the identification number of each of the plurality of bits (for example, 32 bits) possessed by this SW register;

HW register name: the name of the HW register which is allocated to each of the bit positions of this SW register;

and the like.

As shown by way of example in FIG. 18, to consider the SW register "REG02" which has the SW register attribute "DIAG" which belongs to the sub-block layer "SBLK00": the HW register "STATEVAR" is mapped to its 31st bit; the HW register "CNT" is mapped to its 23rd bit; and the 31st to the 16th bits of the HW register "DOUT" are mapped to its 15th to 0th bits.

The results of the group setting and the register address setting performed by the designer 240 in the step S53 of FIG. 15, such as shown by way in example in FIGS. 17 and 18, are reflected in the diagnosis group table 260, the SW register management table 262 and the HW register management table 264 which are shown by way of example in FIGS. 16A through 16C. On the other hand, in the step S54, a similar group setting and register address setting are performed automatically, and the results thereof are reflected in the diagnosis group table 260, the SW register management table 262 and the HW register management table 264 which are shown by way of example in FIGS. 16A through 16C.

In the step S55 of FIG. 15, the diagnosis group definition information 200 and the diagnosis address definition information 202 are generated automatically on the basis of the diagnosis group table 260, the SW register management table 262, and the HW register management table 264 which have been generated as described above.

As shown by way of example in FIG. 19A, in the diagnosis group definition information 200, detailed information for each diagnosis group which has been set is described, for example:

Diagnosis group ID: a unique identification value which is allocated to this diagnosis group;

Higher-order address: a higher-order address in the software address space which is allocated to this diagnosis group;

and the like.

As shown by way of example in FIG. 19B, in the diagnosis address definition information 202, detailed information which specifies the relationship between each HW register (i.e. each diagnosis candidate register) and the SW register which is mapped thereto is described, for example:

Diagnosis group ID: the identification value of the diagnosis group to which this HW register belongs;

SW register name: the name of the SW register to which this HW register is mapped;

SW register attributes: the SW register attributes of this SW register;

Lower-order address: the lower-order address of the start address position in the software address space of this SW register;

HW register name: the name of this HW register;

Start bit position: in this SW register, the start bit position of the bit position range to which this HW register is mapped;

End bit position: in this SW register, the end bit position of the bit position range to which this HW register is mapped;

Block layer name: the name of the block layer to which this HW register belongs;

Sub-block layer name: the name of the sub-block layer to which this HW register belongs;

Variable attributes: the variable attributes of the variable at the behavior level which corresponds to this HW register;

and the like.

FIGS. 20 through 25 show the flow of processing in the step S31 shown in FIG. 12 (i.e. of the processing which is performed by the diagnostic logic automatic generation tool 188).

In a step S60 of FIG. 20, the first behavior level design data 192 (in which only the normal system is described) is imported, and is copied as the second behavior level design data 204. Subsequently a diagnosis system, in which diagnostic circuitry of various types is included as shown in FIG. 5, is added to this second behavior level design data 204.

In a step S61, the diagnosis group definition information 200 is imported, and the diagnosis group management table 260 (see FIG. 16A) is generated from this diagnosis group definition information 200. And in a step S62, the diagnosis address definition information 202 is imported, and the SW register management table 262 (see FIG. 16B) and the HW register management table 2645 (see FIG. 16C) are generated from this diagnosis address definition information 202.

In a step S63, on the basis of the diagnosis group management table 260 (see FIG. 16A), the first diagnosis repeater circuit 212 (see FIG. 5) is generated (this is a description at the behavior level), and is added to the second behavior level design data 204.

And in a step S64, all of the plurality of diagnosis groups 210 which are described in the diagnosis group management table 260 (see FIG. 16A) are extracted.

Figure 21:
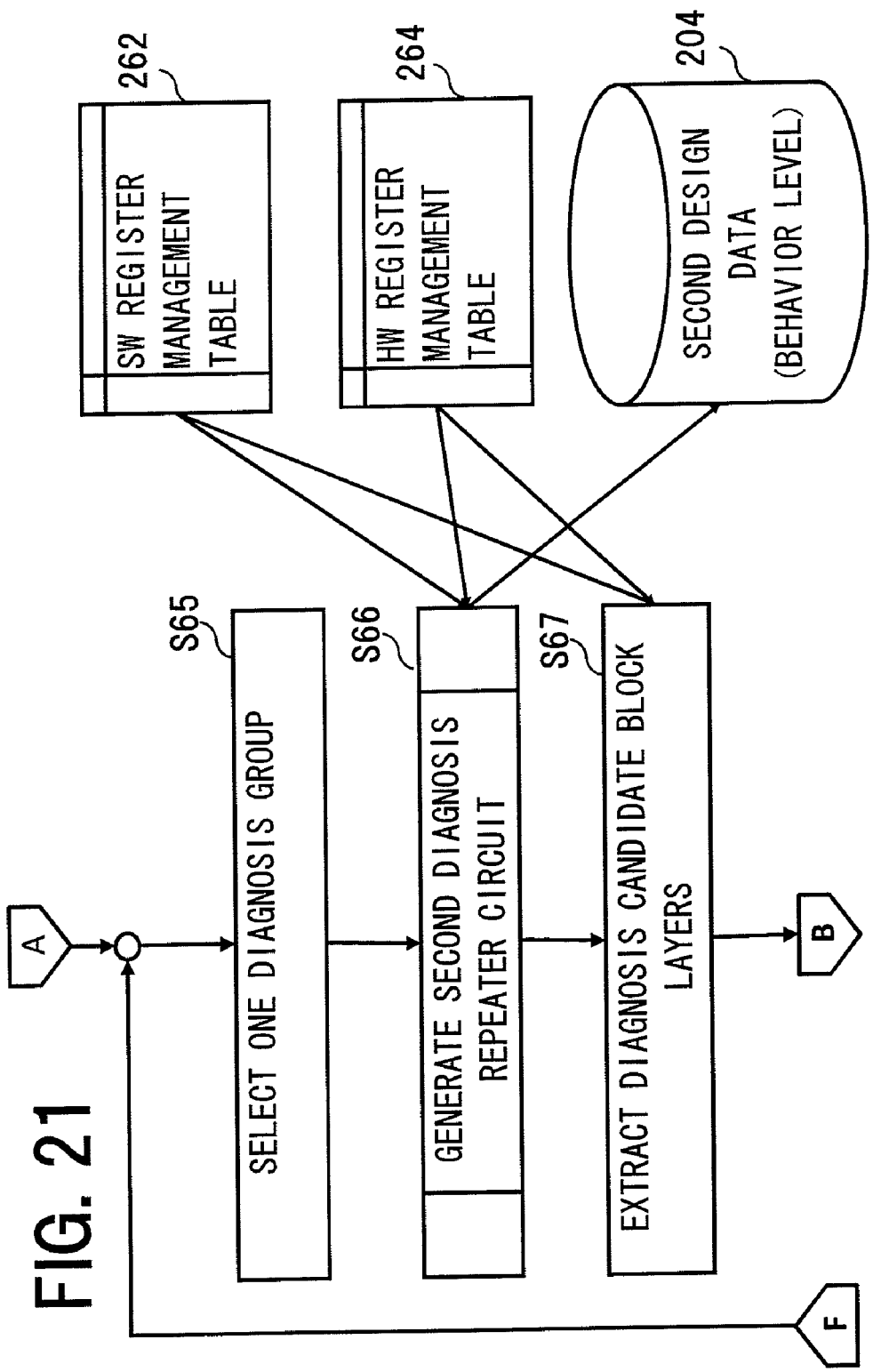
FIG. 21 is another part of the flow chart showing the flow of processing in the step S31 shown in FIG. 12 (processing which is performed by the diagnostic logic automatic generation tool 188).

In a step S65 of FIG. 21, one diagnosis group 210 is selected from among the plurality of diagnosis groups which were extracted in the step S64.

In a step S66, the SW register management table 262 (see FIG. 16B) is referred to for the diagnosis group 210 which was selected in the step S65. And, on the basis of the detailed information in the SW register management table 262 (see FIG. 16B) for the plurality of SW registers which belong to this diagnosis group 210 which has been selected, the second diagnosis repeater circuit 214 (see FIG. 5) for the diagnosis group 210 which has been selected is generated (this is a description at the behavior level), and this is added to the second behavior level design data 204.

Then, in a step S67, the HW register management table 264 (see FIG. 16C) is referred to for the plurality of SW registers within the diagnosis group which has been selected. And, on the basis of the detailed information in the HW register management table 264 (see FIG. 16C) for the plurality of HW registers which belong to this diagnosis group 210 which are mapped to those SW registers, all of the plurality of diagnosis candidate block layers 162 which belong to the diagnosis group 210 which has been selected are extracted.

Figure 22:
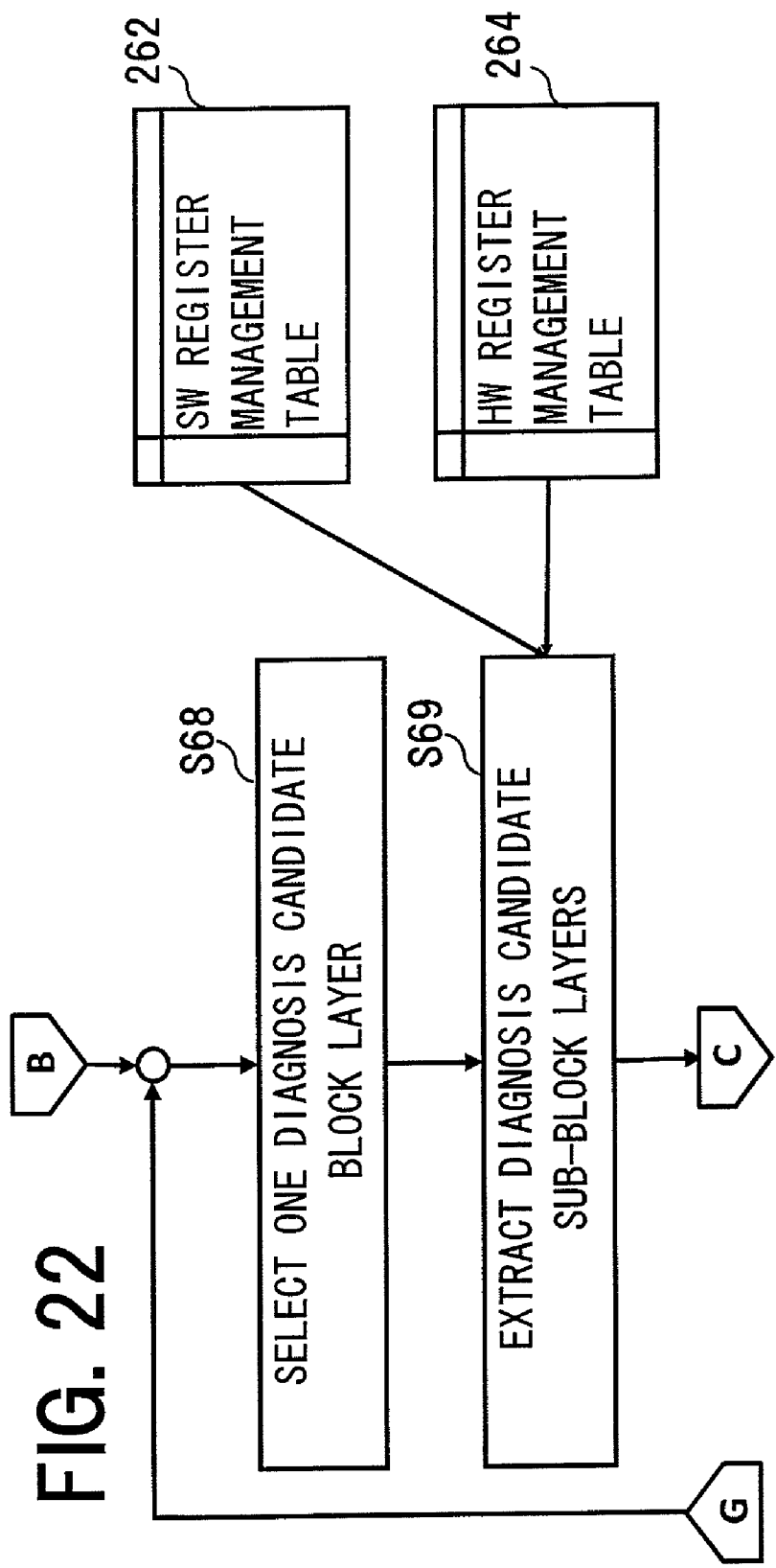
FIG. 22 is yet another part of the flow chart showing the flow of processing in the step S31 shown in FIG. 12 (processing which is performed by the diagnostic logic automatic generation tool 188).

In a step S68 of FIG. 22, one diagnosis candidate block layer 162 is selected from among the plurality of diagnosis candidate block layers 162 which were extracted in the step S67. And, in a step S69, the HW register management table 264 (see FIG. 16C) is referred to for the diagnosis candidate block layer 162 which has been selected in the step S68, and all of the plurality of diagnosis candidate sub-block layers 164 which belong to the diagnosis candidate block layer 162 which has been selected are extracted.

Figure 23:
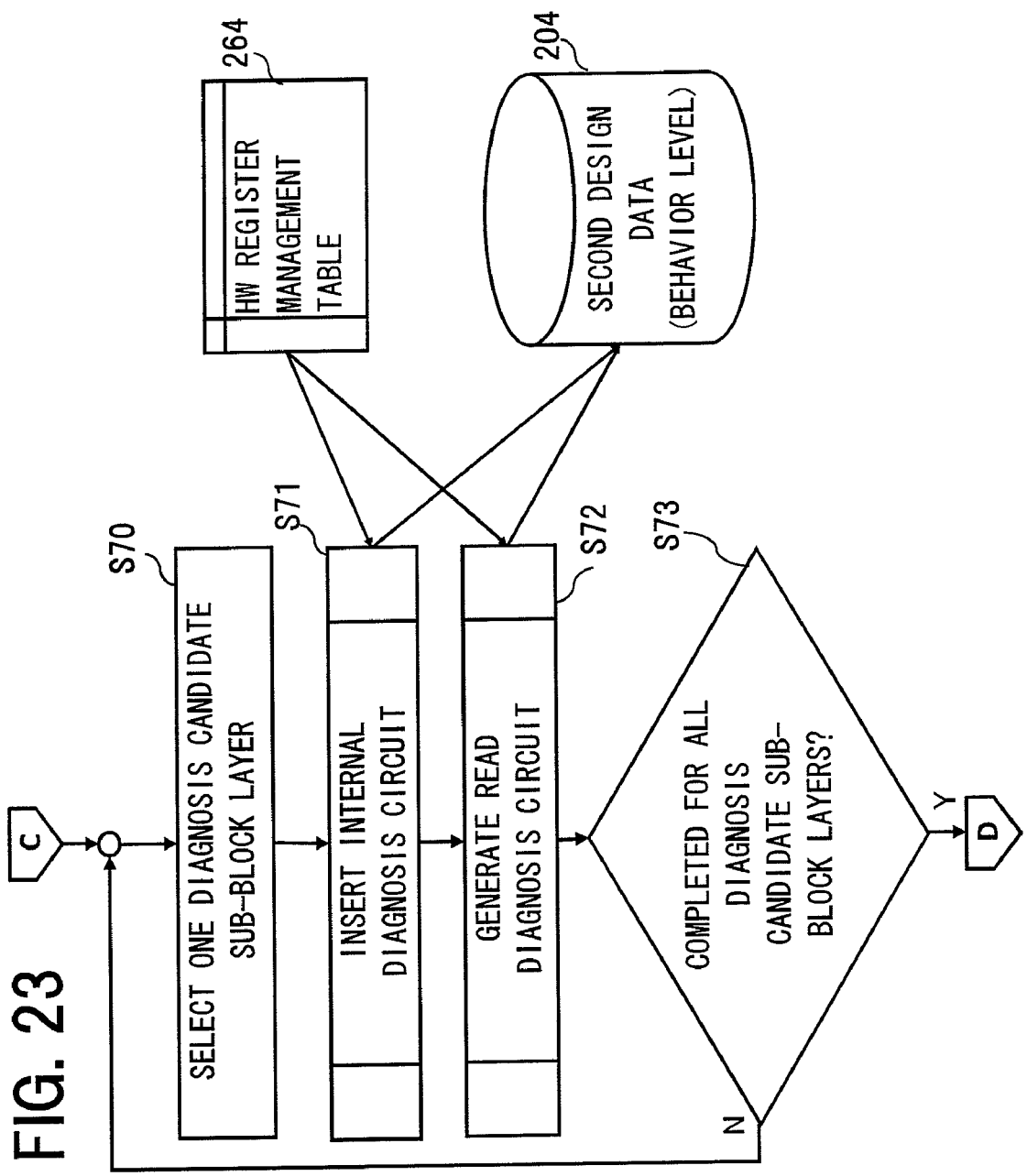
FIG. 23 is still another part of the flow chart showing the flow of processing in the step S31 shown in FIG. 12 (processing which is performed by the diagnostic logic automatic generation tool 188).

In a step S70 of FIG. 23, one diagnosis candidate sub-block layer 164 is selected from among the plurality of diagnosis candidate sub-block layers 164 which were extracted in the step S69.

Then in a step S71, on the basis of the detailed information in the HW register management table 264 (see FIG. 16C) for the diagnosis candidate sub-block layer 164 which has been selected, the internal diagnosis circuit 218 (see FIG. 5) for that diagnosis candidate sub-block layer 164 which has been selected is generated (this is a description at the behavior level), and this is added to the second behavior level design data 204 (i.e. is inserted into the behavior level description of the diagnosis candidate sub-block layer 164 which has been selected).

And in a step S72, on the basis of the detailed information in the HW register management table 264 (see FIG. 16C) for the diagnosis candidate sub-block layer 164 which has been selected, the read diagnosis circuit 220 (see FIG. 5) for that diagnosis candidate sub-block layer 164 which has been selected is generated (this is a description at the behavior level), and this is added to the second behavior level design data 204.

Then, by a step S73, the steps S70 through S72 of FIG. 23 are repeated for all of the plurality of diagnosis candidate sub-block layers 164 which were extracted in the step S69 of FIG. 22.

Figure 24:
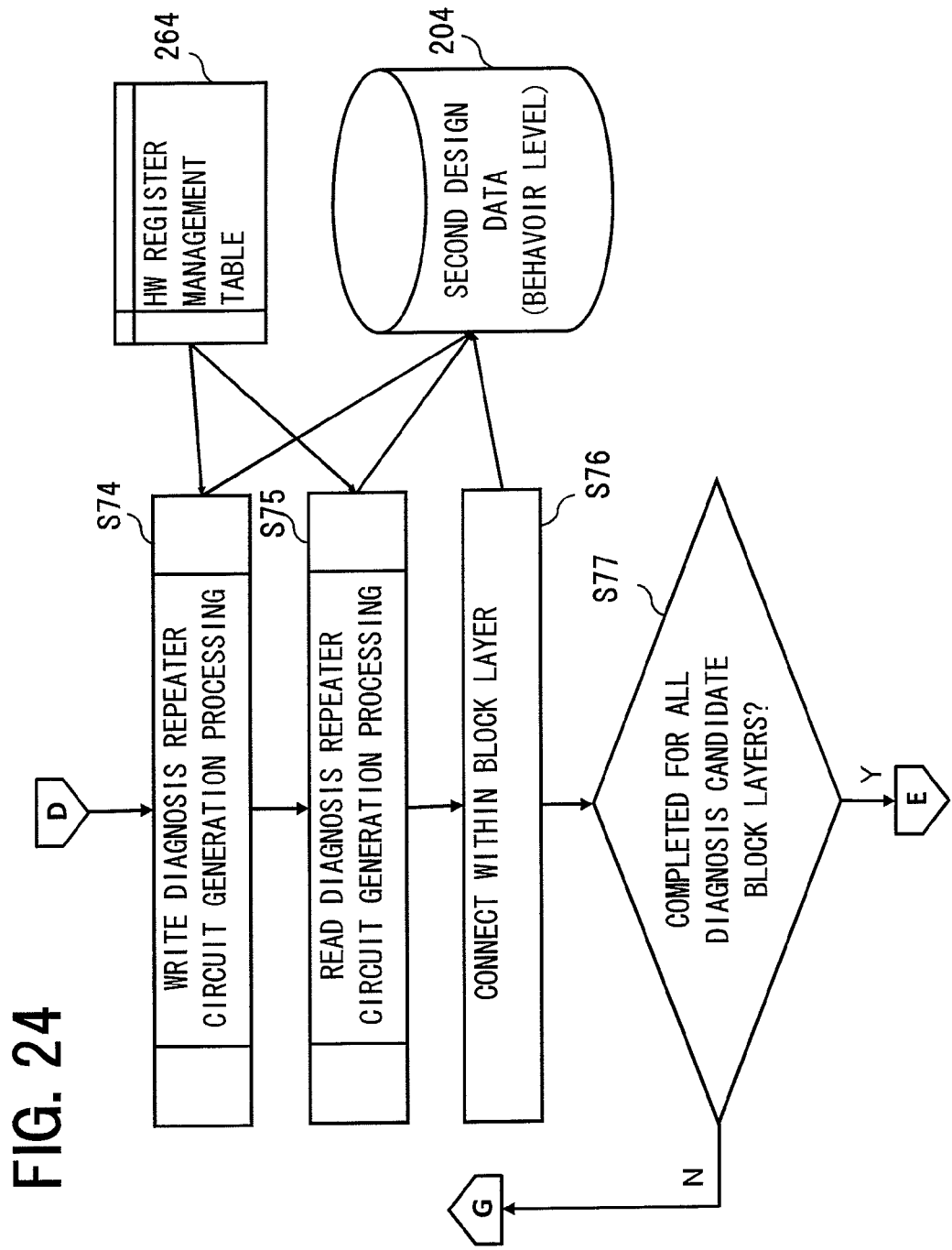
FIG. 24 is even another part of the flow chart showing the flow of processing in the step S31 shown in FIG. 12 (processing which is performed by the diagnostic logic automatic generation tool 188).

Thereafter, in the steps S74 and S75 of FIG. 24, the HW register management table 264 (see FIG. 16C) is referred to for the diagnosis candidate block layer 162 which has been selected in the step S68. And, on the basis of the detailed information in the HW register management table 264 (see FIG. 16C) in relation to the diagnosis candidate block layer 162 which has been selected, the read diagnosis circuit 222 and the write diagnosis circuit 216 (see FIG. 5) for that diagnosis candidate block layer 162 which has been selected are generated (these are descriptions at the behavior level), and these are added to the second behavior level design data 204.

And in a step S76 communication connections for diagnosis within the diagnosis candidate block layer 162 which has been selected are generated (this is a description at behavior level), and these are added to the second behavior level design data 204.

Then, by a step S77, the steps S68 of FIG. 22 through S76 of FIG. 24 are repeated for all of the plurality of diagnosis candidate block layers 162 which were extracted in the step S67 of FIG. 21.

Figure 25:
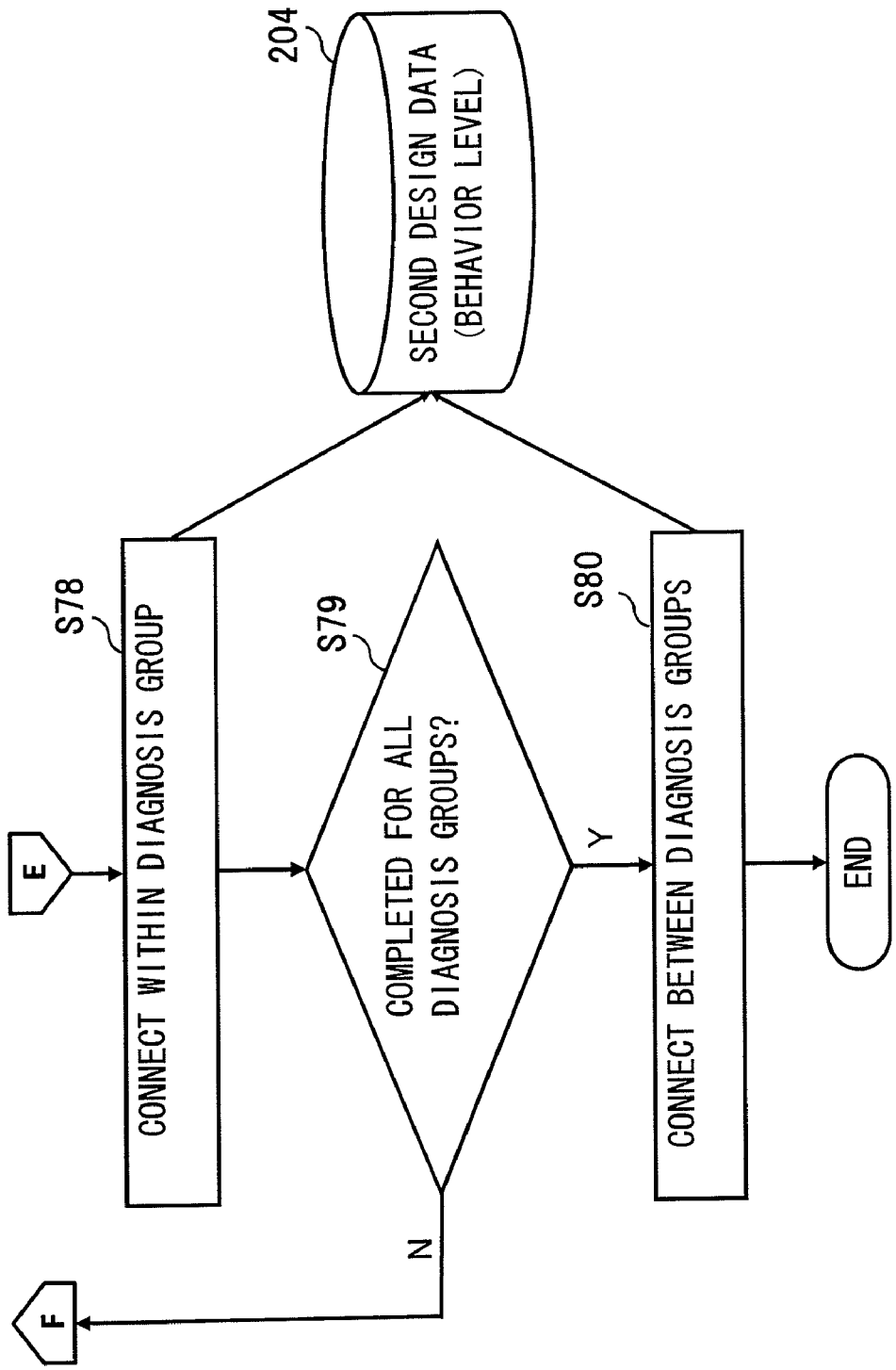
FIG. 25 is still yet another part of the flow chart showing the flow of processing in the step S31 shown in FIG. 12 (processing which is performed by the diagnostic logic automatic generation tool 188).

Thereafter, in a step S78 of FIG. 25, communication connections for diagnosis within the diagnosis group 21 which was selected are generated (this is a description at behavior level), and these are added to the second behavior level design data 204.

Then, by a step S79, the steps S65 of FIG. 21 through S78 of FIG. 25 are repeated for all of the plurality of diagnosis groups 210 which were extracted in the step S64 of FIG. 20.

Thereafter, in a step S80, connections between the first diagnosis repeater circuit 212 and the second diagnosis repeater circuits 214 of the diagnosis groups are generated (this is a description at the behavior level), and these are added to the second behavior level design data 204.

As the result of the above, the second behavior level design data 204 is completed, in which is described the completed logic in which the diagnosis system is added to the normal system.

Figure 26:
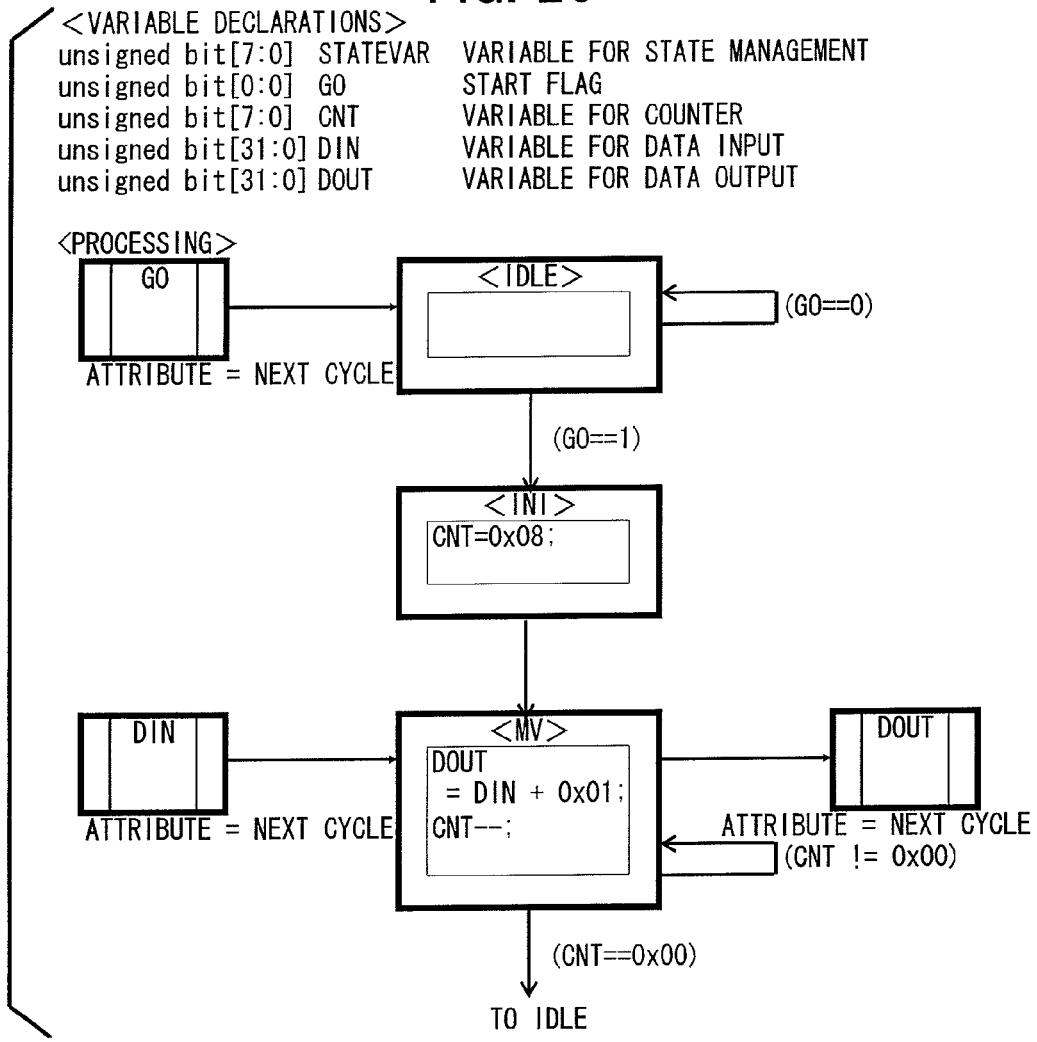
FIG. 26 is a figure showing an example of a description at behavior level of a certain diagnosis candidate sub-block layer 162 which is included in first behavior level design data 192.

FIG. 26 shows a sample description of some diagnosis candidate sub-block layer 162 which is included in the first behavior level design data 192 (see FIG. 4).

According to the example shown in FIG. 26, in the behavior model for this sub-block layer 164, there may be included, for example, a plurality of variables such as those shown below:

STATEVAR (variable attribute=ST: state management variable);
GO (variable attribute=CH: variable for communication channel);
CNT (variable attribute=LV: local variable);
DIN (variable attribute=CH: variable for communication channel); and
DOUT (variable attribute=CH: variable for communication channel).

The blocks denoted by "IDLE", "INI", and "MV" in the description of the processing mean the plurality of states possessed by the FSM of this sub-block layer, and this state is shown by the value of the state management variable "STATEVAR".

Figure 27:
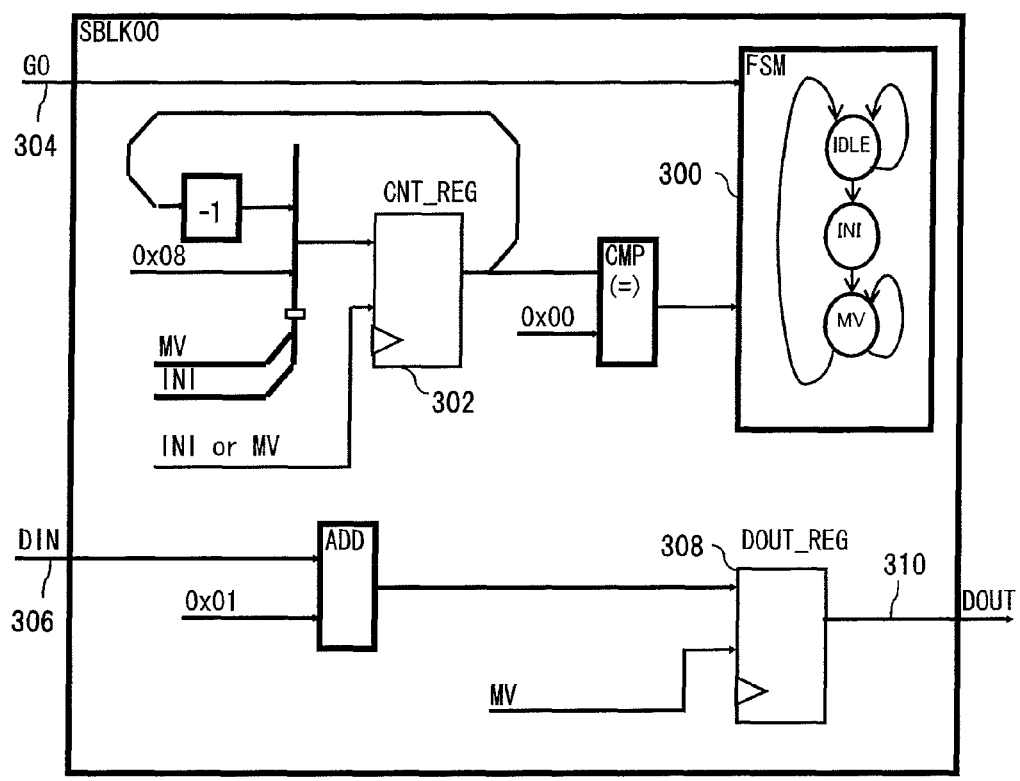
FIG. 27 is a figure showing an example of an RTL description which is converted by high level synthesis from the behavior level description example shown in FIG. 26.

FIG. 27 shows an RTL description example which is generated by the high level synthesis tool 182 (see FIG. 4) on the basis of the behavior level description example shown in FIG. 26. To put it in another manner, FIG. 27 shows an RTL description example of the above described certain sub-block layer 164 which is included in the first RTL design data 194 (see FIG. 4).

As shown in FIG. 27, a register which shows the state within the FSM 300 is generated from the state management variable "STATEVAR", and also a register 302 is generated from the local variable "CNT". From the variables for communication channels "GO", "DIN", and "DOUT", since all of those are of the type which sends data in the next cycle, sets are generated of a register which stores the value of a respective variable, and a connection line which sends this value to a reception side circuit. For example, from the variable for communication channel "DOUT", a set is generated consisting of a register 308 and a connection line 310. And, from the variables for communication channels "GO" and "DIN", although the respective connection lines 304 and 306 are generated, the registers which correspond to these two are generated within send side circuits which are not shown in the figure.

Figure 28:
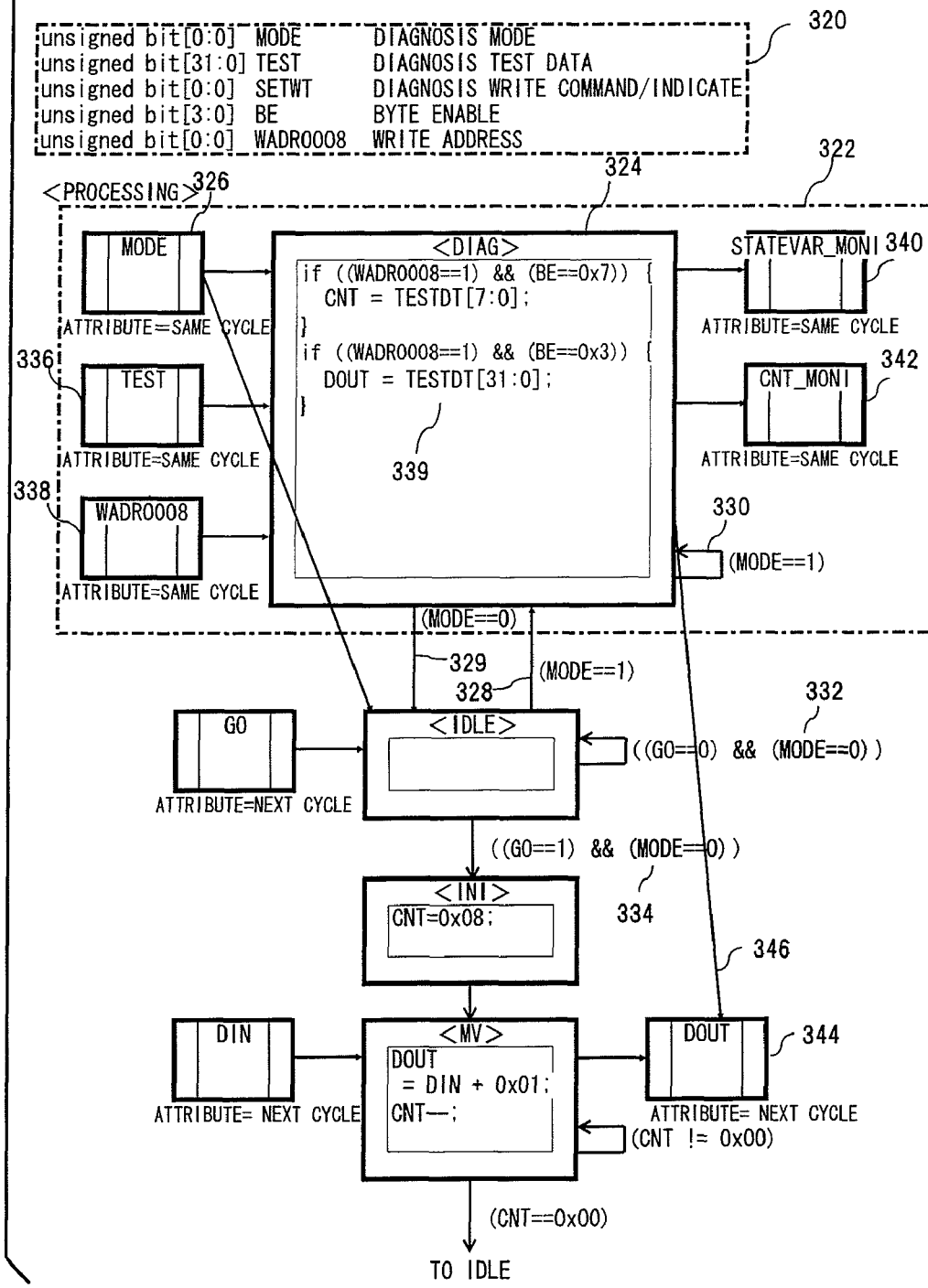
FIG. 28 is a figure showing an example of a behavior level description, consisting of the behavior level description shown in FIG. 26, into which an internal diagnosis circuit has been inserted.

FIG. 28 shows a behavior level description example which is generated by the diagnostic logic automatic generation tool 188 (see FIG. 4), in which an internal diagnosis circuit has come to be inserted into the behavior level description example shown in FIG. 26. To put it in another manner, FIG. 28 shows a behavior level description example of the above described certain sub-block layer 164 which is included in the second behavior level design data 204 (see FIG. 4).

In FIG. 28, as shown within the rectangular frame 320, there are added a plurality of new variables which are used for the diagnosis, for example:

MODE: a diagnosis mode setting variable in which the diagnosis mode setting data is stored;
TEST: a test data variable in which the input test data is stored (variable attributes=NONE);
SETWT: a diagnosis write command variable in which an input test data write command is stored (variable attribute=NONE);
BE: a byte enable variable in which a byte enable signal is stored (variable attribute=NONE); and
WADR0008: a write address flag variable in which the address flag of the register to be diagnosed (i.e. of the variable to be diagnosed), in which the input test data is written, is stored (variable attribute=NONE), the write address flag turned to "1" when a write access to the corresponding address from the MPU starts, and turned to "0" when the write access ends.

Furthermore, as shown in the rectangular frame 322, a description of the processing to be performed by the internal diagnosis circuit 218 is added. or example, as shown in the block 324, a diagnosis state (DIAG) is added as one state possessed by the FSM (to put it in another manner, as one of the values which the state management variable "STATEVAR" can assume). And, in order to perform changeover between the diagnosis mode (in other words, the diagnosis state) and the normal mode (in other words, some other state), a mode setting data input communication channel 326 is added, which inputs diagnosis mode setting data (for example the single bit value "1") or normal mode setting data (for example the single bit value "0") from a diagnosis mode setting variable "MODE" (the mode setting register 146 (see FIG. 2) which corresponds to this is provided within the second diagnosis repeater circuit 214). Furthermore, conditions 328, 329, and 330 are added for, according to the value of the diagnosis mode setting variable "MODE", causing transition from some other state to the diagnosis state, and transition in the reverse direction. Moreover, to the condition for transiting between the states within the normal mode, there are added descriptions 332 and 334 which mean that the condition for transition to the diagnosis state is not fulfilled.

Furthermore, in order to write the input test data into the register to be diagnosed which has been designated (i.e. into the variable to be diagnosed), there are added an input test data communication channel 336 which inputs the input test data from the test data variable "TEST" (the test data register 148 (see FIG. 2) which corresponds to this is provided within the second diagnosis repeater circuit 214), and an address communication channel 338 which inputs the address of the register to be diagnosed from the write address flag variable "WADR0008" (the address register which corresponds to this is provided within the first or the second diagnosis repeater circuit 212 or 214). And a description 339 is added that, in the diagnosis state, the input test data is written to the register to be diagnosed whose address has been designated (i.e. to the variable to be diagnosed). Here, during the diagnosis state, although the input test data comes to be written into a local variable such as "CNT" or to a variable for communication channel such as "DOUT", the input test data is not written into the state management variables such as "STATEVAR".

Moreover, a state management variable communication channel 340 is added for, during the diagnosis state, reading the data for a state management variable such as "STATEVAR" to the exterior of this sub-block layer 164. Furthermore, a local variable communication channel 342 is added for, during the diagnosis state, reading the data for a local variable such as "CNT" to the exterior of this sub-block layer 164. Yet further, so as to utilize a communication channel 344 for some variable which is already present within the normal system, an access means 346 (i.e. a communication channel function) to the same communication channel 344 is added for, during the diagnosis state, reading the data for a variable for communication channel such as "DOUT" to the exterior of this sub-block layer 164.

In this manner, the circuit elements for diagnosis which are added are different, according to whether the variable attributes of the variable to be diagnosed (i.e. the register to be diagnosed) within the normal system is a state management variable (ST), a local variable (LV), or a variable for communication channel (CH).

Figure 29:
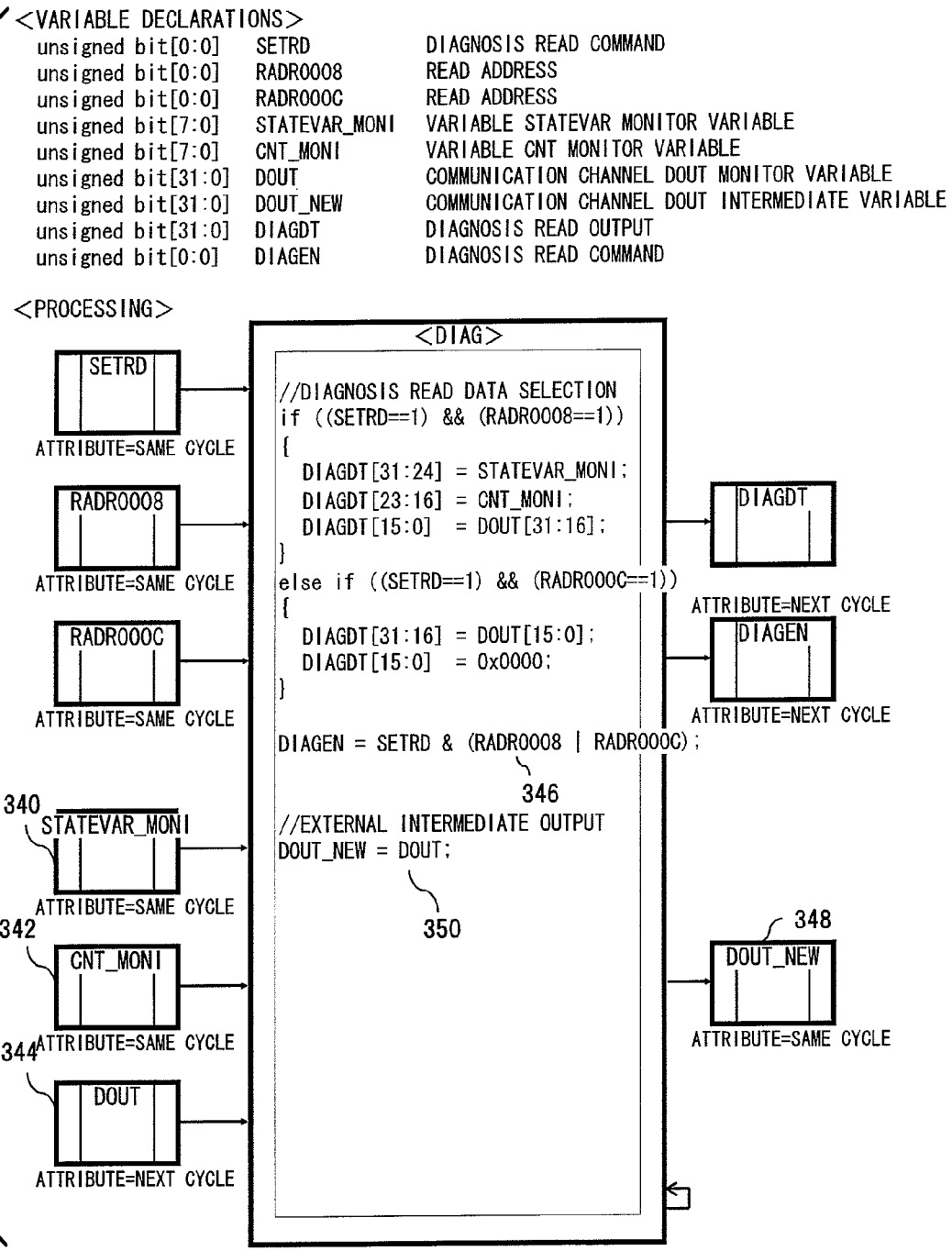
FIG. 29 is a figure showing an example of a behavior level description of a read diagnosis circuit which has been generated corresponding to an internal diagnosis circuit shown in FIG. 28.

FIG. 29 shows a behavior level description example of a read diagnosis circuit 220 which is generated by the diagnostic logic automatic generation tool 188 (see FIG. 4) according to the internal diagnosis circuit shown in FIG. 28. To put it in another manner, FIG. 29 shows a behavior level description example of a read diagnosis circuit 220 for the above described some sub-block layer 164 which is included in the second behavior level design data 204 (see FIG. 4).

As shown in FIG. 29, the read diagnosis circuit 220 is adapted to read data of the variable to be diagnosed (i.e. of the register to be diagnosed) of the state management variable, the local variable, or the variable for communication channel or the like, from the previously described communication channel 340, 342, or 344, respectively. And, according to the description 346, this read diagnosis circuit 220 is adapted to set the data of the variables to be diagnosed (i.e. of the registers to be diagnosed) (according to the description in the HW register management table 264 (see FIG. 16C)) which has been read to the address positions of the SW registers onto which the variables to be diagnosed (i.e. the registers to be diagnosed) are mapped.

Furthermore, the read diagnosis circuit 220 has an intermediate communication channel 348, and is adapted to output to the exterior of the read diagnosis circuit 220, via this intermediate communication channel 348, the data which has been read from the communication channel variable according to the description 350. The reason for this is in order to send the data of this variable for communication channel via the above described intermediate communication channel 348, as opposed to via some other circuit in the normal system which is adapted to receive the data for this variable for communication channel.

Figure 30:
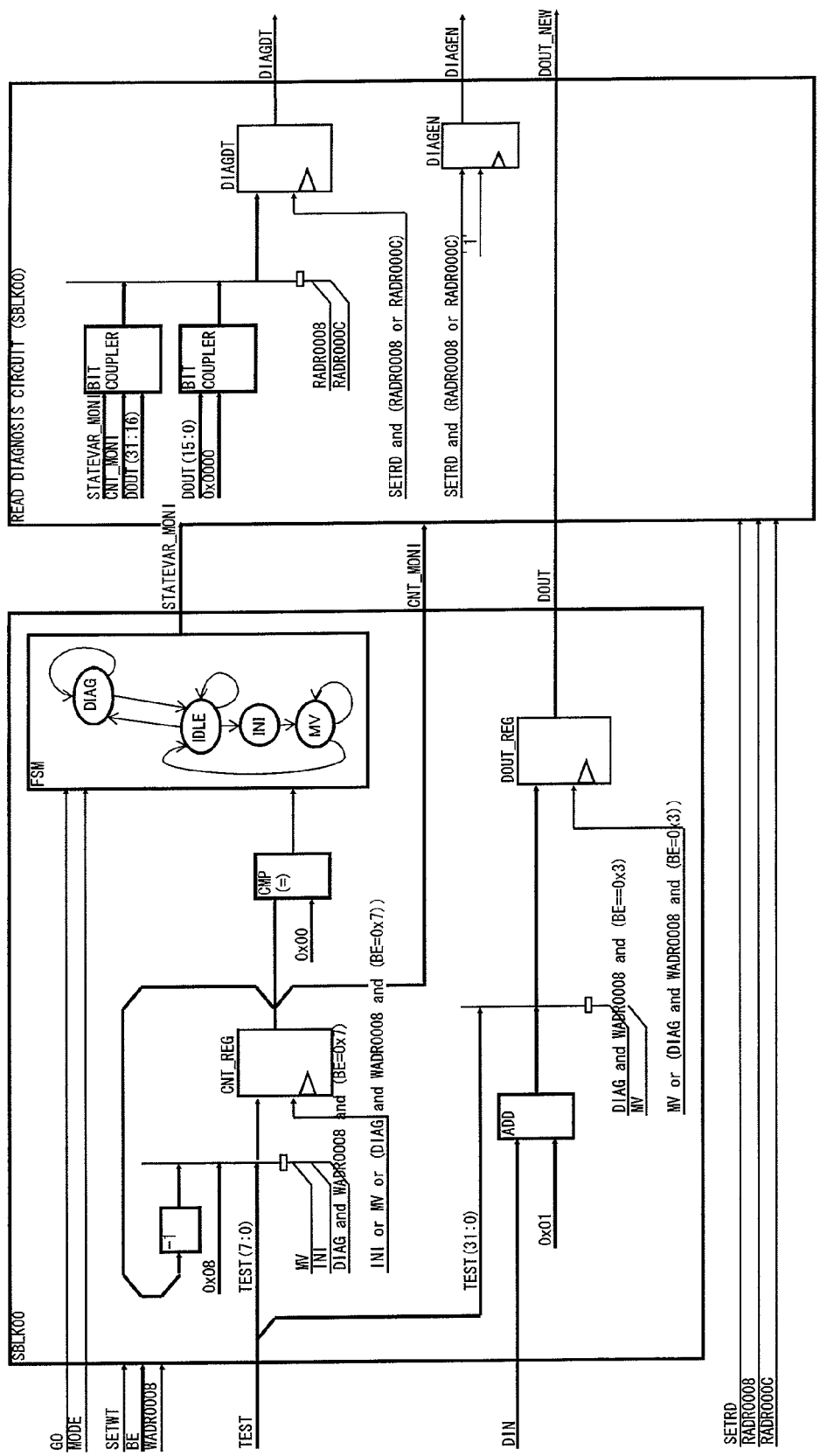
FIG. 30 is a figure showing an example of an RTL description which is converted by high level synthesis from the examples of behavior level descriptions shown in FIGS. 28 and 29.

From the behavior level description example shown in FIGS. 28 and 29 and described above, when the high level synthesis is performed for the second time, an RTL description example such as that shown in FIG. 30 is obtained.

Although a preferred embodiment of the present invention has been explained in the above, this example has only been given in order to explain the present invention; the scope of the present invention is not to be considered as being limited only to this embodiment. The present invention may be implemented in various ways other than the embodiment described above, provided that its gist is not deviated from.

The invention claimed is:

1. A large scale integration (LSI) design apparatus for designing an LSI having both a normal system for performing normal functions, and a diagnosis system for communicating with a diagnosis micro-program which is executed externally to interject diagnosis data of said diagnosis micro-program into said normal system during momentary interruption of said normal system, to perform real-time detection of the occurrence of a fault of said normal system, comprising:

a behavior model design device which generates first behavior level design data, in which the logic of said normal system in said LSI is described, and including a plurality of variables;

a high level synthesis device which inputs said first behavior level design data, and, on the basis of said first behavior level design data, generates both first register transfer level (RTL) design data in which the logic of said normal system is described and in which a plurality of hardware registers are included, and a high level synthesis log which specifies said plurality of hardware registers within said first RTL design data;

a diagnosis candidate analysis device which inputs said first behavior level design data and said high level synthesis log, and, on the basis of said first behavior level design data and said high level synthesis log, detects, from a plurality of variables within said first behavior level design data, a plurality of diagnosis candidate variables which respectively correspond to said plurality of hardware registers within said first RTL design data, and generates diagnosis candidate information in which said mutually corresponding plurality of diagnosis candidate variables and said plurality of hardware registers are specified, where said plurality of diagnosis candidate variables are useable during said momentary interruption of said normal system, to perform said real-time detection of the occurrence of a fault during said operation of said normal system;

a register address setting device which inputs said diagnosis candidate information, maps said plurality of hardware registers which are specified in said diagnosis candidate information onto a software address space to be used by said diagnosis micro-program during said momentary interruption of said normal system, to perform said real-time detection of the occurrence of a fault during said operation of said normal system, and generates diagnosis address definition information which specifies the address positions of a plurality of registers in said software address space; and a diagnostic logic automatic generation device which inputs said first behavior level design data and said diagnostic address definition information, and, on the basis of said first behavior level design data and said diagnostic address definition information, generates second behavior level design data for said LSI, in which both said normal system and said diagnosis system are included;

wherein said high level synthesis device further inputs said second behavior level design data, and, on the basis of said second behavior level design data, generates second RTL design data, in which is described completed logic which includes logic for said normal system, as well as diagnostic system logic to be used by said diagnosis micro-program during said momentary interruption of said normal system, to perform said real-time detection of the occurrence of a fault during said operation of said normal system; and said LSI design apparatus further comprising a logic synthesis device which inputs said second RTL design data, and, on the basis of said second RTL design data, generates gate level design data in which said completed logic is described.

2. The LSI design apparatus according to claim 1, wherein said first behavior level design data describes said normal system as a hierarchical structured behavior model, having a plurality of block layers, a plurality of sub-block layers included in each of said plurality of block layers, and a plurality of variables included in each of said plurality of sub-block layers.

3. The LSI design apparatus according to claim 2, wherein:
said diagnosis candidate analysis device, on the basis of said first behavior level design data, further specifies, from among said plurality of block layers, a plurality of diagnosis candidate sub-blocks in which said plurality of diagnosis candidate variables are included, and a plurality of diagnosis candidate block layers in which said plurality of diagnosis candidate sub-blocks are included, and generates said diagnosis candidate information so that said diagnosis candidate information (198) further specifies said plurality of diagnosis candidate block layers;

said register address setting device, on the basis of said diagnosis candidate information, groups said plurality of diagnosis candidate block layers into a plurality of diagnosis groups the number of which is smaller than the number of said diagnosis candidate block layers, and further generates diagnosis group definition information which specifies which, among said plurality of diagnosis candidate block layers, each of said plurality of diagnosis groups includes; and said diagnostic logic automatic generation device further inputs said diagnosis group definition information, and, on the basis of said diagnosis address definition information and said diagnosis group definition information, generates said second behavior level design data by adding, to said first behavior level design data, behavior level design data for said diagnosis system, including:

A. a first diagnosis repeater circuit which receives from said diagnosis program input test data to be written into a variable to be diagnosed within said normal system, and returns to said diagnosis program output test data which is outputted from said variable to be diagnosed; and B. a second diagnosis repeater circuit, provided for each of said diagnosis groups, which receives said input test data from said first diagnosis repeater circuit and sends said input test data to a designated one among said plurality of diagnosis candidate block layers in said diagnosis groups, and which moreover receives said output test data from said designated one among said plurality of diagnosis candidate block layers in said diagnosis groups and returns said output test data to said first diagnosis repeater circuit.

4. The LSI design apparatus according to claim 3, wherein:
said diagnostic logic automatic generation device, on the basis of said diagnosis address definition information and said diagnosis group definition information, generates said second behavior level design data by adding, to said first behavior level design data, behavior level design data for said diagnosis system, further including:

A. said first diagnosis repeater circuit;
B. said second diagnosis repeater circuit, provided to each of said diagnosis groups;
C. an write diagnosis circuit, provided to each of said diagnosis candidate block layers in said diagnosis groups, which receives said input test data from said second diagnosis repeater circuit of said diagnosis group, and sends said input test data to a designated one among said plurality of diagnosis candidate sub-block layers in said diagnosis candidate block layers;
D. an internal diagnosis circuit, provided to each of said plurality of diagnosis candidate sub-block layers in said diagnosis candidate block layers, which receives said input test data from said write diagnosis circuit of said diagnosis candidate block layer, inputs said input test data to said variable to be diagnosed among said plurality of diagnosis candidate variables in said diagnosis candidate sub-block layer, and receives said output test data from said variable to be diagnosed;
E. a read diagnosis circuit, provided to each of said plurality of diagnosis candidate sub-block layers in said diagnosis candidate block layers, which receives said output test data from said internal diagnosis circuit in said diagnosis candidate sub-block layer; and
F. an read diagnosis circuit, provided to each of said plurality of diagnosis candidate block layers in said diagnosis groups, which receives said output test data from said plurality of read diagnosis circuits in said diagnosis candidate block layer, and returns said output test data to said second diagnosis repeater circuit of said diagnosis groups.

5. The LSI design apparatus according to claim 4, wherein:
said diagnosis candidate analysis device, on the basis of said first behavior level design data, decides to which of a predetermined plurality of variable attributes, including the following A), B), and C), each of said plurality of diagnosis candidate variables in said sub-block layers corresponds:
A) a state management variable for specifying the state of a state machine in said sub-block layer;
B) a local variable which is referred to only within said sub-block layers; and
C) a channel variable for communication, for outputting data of a predetermined variable within said sub-block layer to a predetermined other sub-block layer;
and said diagnostic logic automatic generation device receives the result of decision by said diagnosis candidate analysis device, and generates said internal diagnosis circuits in said sub-block layers upon said first behavior level design data by:
a) adding a diagnosis state to the plurality of states possessed by said state machine;
b) adding a mode setting communication channel for inputting diagnosis mode setting data and normal mode setting data for causing said state machine to transit between said diagnosis state and some other predetermined state;
c) adding an input test data communication channel for, when said state machine is in said diagnosis state, writing said input test data from said write diagnosis circuit to said local variable and said variable for communication channel;
d) adding a state management variable communication channel for, when said state machine is in said diagnosis state, treating data of said state management variable as said output test data, and reading it out to outside said sub-block layers; and
e) adding a local variable communication channel for, when said state machine is in said diagnosis state, treating data of said local variable as said output test data, and reading it out to outside said sub-block layers.

6. The LSI design apparatus according to claim 5, wherein:
said diagnostic logic automatic generation device, upon said first behavior level design data, further:
i) generates said read diagnosis circuit so as, when said state machine is in said diagnosis state: to read data of said state management variable via said state management variable communication channel, to read data of said local variable via said local variable communication channel, and to read data of said variable communication channel, and to treat the data which has been read as said output test data and to send it to said read diagnosis circuit; and moreover
ii) adds an intermediate communication channel for transferring data which has been read out from said variable communication channel to said read diagnosis circuit from said diagnostic circuitry to another sub-block layer within said normal system.

7. The LSI design apparatus according to claim 2, wherein:
said diagnosis candidate analysis device, on the basis of said first behavior level design data, decides to which of a predetermined plurality of variable attributes, including the following A), B), and C), each of said plurality of diagnosis candidate variables in said sub-block layers corresponds:

A) a state management variable (ST) for specifying the state of a state machine in said sub-block layer;
B) a local variable (LV) which is referred to only within said sub-block layer; and
C) a channel variable for communication (CH), for outputting data of a predetermined variable within said sub-block layer to a predetermined other sub-block layers;
and said diagnostic logic automatic generation device receives the result of decision by said diagnosis candidate analysis device, and generates said second behavior level design data upon said first behavior level design data by performing the following i), ii), and iii):
i) for each of said sub-block layers:
  a) adding a diagnosis state (DIAG) to the plurality of states possessed by said state machine;
  b) adding a mode setting communication channel for inputting diagnosis mode setting data and normal mode setting data for causing said state machine to transit between said diagnosis state and some other predetermined state;
  c) adding an input test data communication channel for, when said state machine is in said diagnosis state, inputting test data supplied from said diagnosis program to said local variable and said variable for communication channel;
  d) adding a state management variable communication channel for, when said state machine is in said diagnosis state, reading out data of said state management variable to outside said sub-block layers; and
  e) adding a local variable communication channel for, when said state machine is in said diagnosis state, outputting data of said local variable to outside said sub-block layers;
ii) generating a read diagnosis circuit for, when said state machine is in said diagnosis state: reading data of said state management variable via said state management variable communication channel, reading data of said local variable via said local variable communication channel, and reading data of said variable communication channel, and for sending the data which has been read to said diagnosis program; and
iii) adding an intermediate communication channel for transferring data which has been read out from said variable communication channel to said diagnostic circuitry, from said diagnostic circuitry to another sub-block layer or block layer within said normal system.

8. The LSI design apparatus according to claim 3, wherein:
said diagnosis candidate analysis device, on the basis of said first behavior level design data, decides to which of a predetermined plurality of variable attributes, including the following A), B), and C), each of said plurality of diagnosis candidate variables in said sub-block layers corresponds:
A) a state management variable (ST) for specifying the state of a state machine in said sub-block layer;
B) a local variable (LV) which is referred to only within said sub-block layer; and
C) a channel variable for communication (CH), for outputting data of a predetermined variable within said sub-block layer to a predetermined other sub-block layer;
and said diagnostic logic automatic generation device receives the result of decision by said diagnosis candidate analysis device, and generates said internal diagnosis circuit for each of said sub-block layers upon said first behavior level design data by:
a) adding a diagnosis state (DIAG) to the plurality of states possessed by said state machine;

b) adding a mode setting communication channel for inputting diagnosis mode setting data and normal mode setting data for causing said state machine to transit between said diagnosis state and some other predetermined state;

c) adding an input test data communication channel for, when said state machine is in said diagnosis state, inputting said input test data from said second diagnosis repeater circuit to said local variable and said variable for communication channel;

d) adding a state management variable communication channel for, when said state machine is in said diagnosis state, treating data of said state management variable as said output test data, and reading it out to outside said sub-block layers; and e) adding a local variable communication channel for, when said state machine is in said diagnosis state, treating data of said local variable as said output test data, and reading it out to outside said sub-block layers.

9. The LSI design apparatus according to claim 8, wherein said diagnostic logic automatic generation device, upon said first behavior level design data, further, for each of said sub-block layers:

i) generates a read diagnosis circuit for, when said state machine is in said diagnosis state: reading data of said state management variable via said state management variable communication channel, reading data of said local variable via said local variable communication channel, and reading data of said variable communication channel, and for sending the data which has been read to said second diagnosis repeater circuit as said output test data; and moreover ii) generates an intermediate communication channel for transferring data which has been read out from said variable communication channel to said read diagnosis circuit, from said read diagnosis circuit to another predetermined sub-block layer.

10. A large scale integration (LSI) design method for designing an LSI having both a normal system for performing normal functions, and a diagnosis system for communicating with a diagnosis micro-program which is executed externally to interject diagnosis data of said diagnosis micro-program into said normal system during momentary interruption of said normal system, to perform real-time detection of the occurrence of a fault of said normal system, comprising:

a behavior model design step of generating first behavior level design data, in which the logic of said normal system in said LSI is described, and including a plurality of variables;

a first high level synthesis step of inputting said first behavior level design data, and, on the basis of said first behavior level design data, generating both first register transfer level (RTL) design data in which the logic of said normal system is described and in which a plurality of hardware registers are included, and a high level synthesis log which specifies said plurality of hardware registers within said first RTL design data;

a diagnosis candidate analysis step of inputting said first behavior level design data and said high level synthesis log, and, on the basis of said first behavior level design data and said high level synthesis log, detecting, from a plurality of variables within said first behavior level design data, a plurality of diagnosis candidate variables which respectively correspond to said plurality of hardware registers within said first RTL design data, and generating diagnosis candidate information in which said mutually corresponding plurality of diagnosis candidate variables and said plurality of hardware registers are specified, where said plurality of diagnosis candidate variables are useable during said momentary interruption of said normal system, to perform said real-time detection of the occurrence of a fault during said operation of said normal system;

a register address setting step of inputting said diagnosis candidate information, mapping said plurality of hardware registers which are specified in said diagnosis candidate information onto a software address space to be used by said diagnosis micro-program during said momentary interruption of said normal system, to perform said real-time detection of the occurrence of a fault during said operation of said normal system, and generating diagnosis address definition information which specifies the address positions of a plurality of registers in said software address space;

a diagnostic logic automatic generation step of inputting said first behavior level design data and said diagnostic address definition information, and, on the basis of said first behavior level design data and said diagnostic address definition information, generating second behavior level design data for said LSI, in which both said normal system and said diagnosis system are included;

a second high level synthesis step of further inputting said second behavior level design data, and, on the basis of said second behavior level design data, generating second RTL design data, in which is described completed logic which includes logic for said normal system, as well as diagnostic system logic to be used by said diagnosis micro-program during said momentary interruption of said normal system, to perform said real-time detection of the occurrence of a fault during said operation of said normal system; and a logic synthesis step of inputting said second RTL design data, and, on the basis of said second RTL design data, generating gate level design data in which said completed logic is described.

11. The LSI design method according to claim 10, wherein:

said first behavior level design data is a description of said normal system as a hierarchical structured behavior model, having a plurality of block layers, a plurality of sub-block layers included in each of said plurality of block layers, and a plurality of variables included in each of said plurality of sub-block layers;

and said method further comprising:

a step of further specifying, on the basis of said first behavior level design data, from among said plurality of block layers, a plurality of diagnosis candidate sub-blocks in which said plurality of diagnosis candidate variables are included, and a plurality of diagnosis candidate block layers in which said plurality of diagnosis candidate sub-blocks are included, and generating said diagnosis candidate information so that said diagnosis candidate information further specifies said plurality of diagnosis candidate block layers; and a step of, on the basis of said diagnosis candidate information, grouping said plurality of diagnosis candidate block layers into a plurality of diagnosis groups the number of which is smaller than the number of said diagnosis candidate block layers, and further generating diagnosis group definition information which specifies which, among said plurality of diagnosis candidate block layers, each of said plurality of diagnosis groups includes;

and wherein, in said diagnostic logic generation step, said diagnosis group definition information is further inputted, and, on the basis of said diagnosis address definition information and said diagnosis group definition information, said second behavior level design data is generated by adding, to said first behavior level design data, behavior level design data for said diagnosis system, including:
A. a first diagnosis repeater circuit which receives from said diagnosis program input test data to be written into a variable to be diagnosed within said normal system, and returns to said diagnosis program output test data which is outputted from said variable to be diagnosed; and
B. a second diagnosis repeater circuit, provided for each of said diagnosis groups, which receives said input test data from said first diagnosis repeater circuit and sends said input test data to a designated one among said plurality of diagnosis candidate block layers in said diagnosis groups, and which moreover receives said output test data from said designated one among said plurality of diagnosis candidate block layers in said diagnosis groups and returns said output test data to said first diagnosis repeater circuit.

12. The LSI design method according to claim 11, wherein:
in said diagnostic logic automatic generation step, on the basis of said diagnosis address definition information and said diagnosis group definition information, said second behavior level design data is generated by adding, to said first behavior level design data, behavior level design data for said diagnosis system, further including:
A. said first diagnosis repeater circuit;
B. said second diagnosis repeater circuit, provided to each of said diagnosis groups;
C. a write diagnosis circuit, provided to each of said diagnosis candidate block layers in said diagnosis groups, which receives said input test data from said second diagnosis repeater circuit of said diagnosis group, and sends said input test data to a designated one among said plurality of diagnosis candidate sub-block layers in said diagnosis candidate block layers;
D. an internal diagnosis circuit, provided to each of said plurality of diagnosis candidate sub-block layers in said diagnosis candidate block layers, which receives said input test data from said write diagnosis circuit of said diagnosis candidate block layer, inputs said input test data to said variable to be diagnosed among said plurality of diagnosis candidate variables in said diagnosis candidate sub-block layer, and receives said output test data from said variable to be diagnosed;
E. a read diagnosis circuit, provided to each of said plurality of diagnosis candidate sub-block layers in said diagnosis candidate block layers, which receives said output test data from said internal diagnosis circuit in said diagnosis candidate sub-block layer; and
F. a read diagnosis circuit, provided to each of said plurality of diagnosis candidate block layers in said diagnosis groups, which receives said output test data from said plurality of read diagnosis circuits in said diagnosis candidate block layer, and returns said output test data to said second diagnosis repeater circuit of said diagnosis groups.

13. The LSI design method according to claim 12, further comprising a variable attribute decision step of, on the basis of said first behavior level design data, deciding to which of a predetermined plurality of variable attributes, including the following A), B), and C), each of said plurality of diagnosis candidate variables in said sub-block layers corresponds:
A) a state management variable for specifying the state of a state machine in said sub-block layer;
B) a local variable which is referred to only within said sub-block layer; and
C) a channel variable for communication, for outputting data of a predetermined variable within said sub-block layer to a predetermined other sub-block layer;
and wherein, in said diagnostic logic automatic generation step, the result of decision by said variable attribution decision step is received, and said internal diagnosis circuits in said sub-block layers are generated upon said first behavior level design data by:
a) adding a diagnosis state to the plurality of states possessed by said state machine;
b) adding a mode setting communication channel for inputting diagnosis mode setting data and normal mode setting data for causing said state machine to transit between said diagnosis state and some other predetermined state;
c) adding an input test data communication channel for, when said state machine is in said diagnosis state, writing said input test data from said write diagnosis circuit to said local variable and said variable for communication channel;
d) adding a state management variable communication channel for, when said state machine is in said diagnosis state, treating data of said state management variable as said output test data, and reading it out to outside said sub-block layers;
and e) adding a local variable communication channel for, when said state machine is in said diagnosis state, treating data of said local variable as said output test data, and reading it out to outside said sub-block layers.

14. The LSI design method according to claim 13, wherein:
in said diagnostic logic automatic generation step, upon said first behavior level design data, further:
ii) generates said read diagnosis circuit so as, when said state machine is in said diagnosis state: to read data of said state management variable via said state management variable communication channel, to read data of said local variable via said local variable communication channel, and to read data of said variable communication channel, and to treat the data which has been read as said output test data and to send it to said read diagnosis circuit; and moreover
iii) adds an intermediate communication channel for transferring data which has been read out from said variable communication channel to said read diagnosis circuit from said diagnostic circuitry to another sub-block layer within said normal system.

15. A non-transitory, computer-readable medium embodying a computer program thereon, which program, by being executed upon the computer, causes the computer to perform a method for designing an LSI having both a normal system for performing normal functions, and a diagnosis system for communicating with a diagnosis micro-program which is executed externally to interject diagnosis data of said diagnosis micro-program into said normal system during momentary interruption of said normal system, to perform real-time detection of the occurrence of a fault of said normal system, said method comprising:
a behavior model design step of generating first behavior level design data, in which the logic of said normal system in said LSI is described, and including a plurality of variables;
a first high level synthesis step of inputting said first behavior level design data, and, on the basis of said first behavior level design data, generating both first register transfer level (RTL) design data in which the logic of said normal system is described and in which a plurality of hardware registers are included, and a high level synthesis log which specifies said plurality of hardware registers within said first RTL design data;

a diagnosis candidate analysis step of inputting said first behavior level design data and said high level synthesis log, and, on the basis of said first behavior level design data and said high level synthesis log, detecting, from a plurality of variables within said first behavior level design data, a plurality of diagnosis candidate variables which respectively correspond to said plurality of hardware registers within said first RTL design data, and generating diagnosis candidate information in which said mutually corresponding plurality of diagnosis candidate variables and said plurality of hardware registers are specified, where said plurality of diagnosis candidate variables are useable during said momentary interruption of said normal system, to perform said real-time detection of the occurrence of a fault during said operation of said normal system;

a register address setting step of inputting said diagnosis candidate information, mapping said plurality of hardware registers which are specified in said diagnosis candidate information onto a software address space to be used by said diagnosis micro-program during said momentary interruption of said normal system, to perform said real-time detection of the occurrence of a fault during said operation of said normal system, and generating diagnosis address definition information which specifies the address positions of a plurality of registers in said software address space;

a diagnostic logic automatic generation step of inputting said first behavior level design data and said diagnostic address definition information, and, on the basis of said first behavior level design data and said diagnostic address definition information, generating second behavior level design data for said LSI, in which both said normal system and said diagnosis system are included;

a second high level synthesis step of further inputting said second behavior level design data, and, on the basis of said second behavior level design data, generating second RTL design data, in which is described completed logic which includes logic for said normal system, as well as diagnostic system logic to be used by said diagnosis micro-program during said momentary interruption of said normal system, to perform said real-time detection of the occurrence of a fault during said operation of said normal system; and a logic synthesis step of inputting said second RTL design data, and, on the basis of said second RTL design data, generating gate level design data in which said completed logic is described.

16. The medium according to claim 15, wherein:

said first behavior level design data is a description of said normal system as a hierarchical structured behavior model, having a plurality of block layers, a plurality of sub-block layers included in each of said plurality of block layers, and a plurality of variables included in each of said plurality of sub-block layers;

and said method further comprising:

a step of further specifying, on the basis of said first behavior level design data, from among said plurality of block layers, a plurality of diagnosis candidate sub-blocks in which said plurality of diagnosis candidate variables are included, and a plurality of diagnosis candidate block layers in which said plurality of diagnosis candidate sub-blocks are included, and generating said diagnosis candidate information so that said diagnosis candidate information further specifies said plurality of diagnosis candidate block layers; and a step of, on the basis of said diagnosis candidate information, grouping said plurality of diagnosis candidate block layers into a plurality of diagnosis groups the number of which is smaller than the number of said diagnosis candidate block layers, and further generating diagnosis group definition information which specifies which, among said plurality of diagnosis candidate block layers, each of said plurality of diagnosis groups includes;

and wherein, in said diagnostic logic generation step, said diagnosis group definition information is further inputted, and, on the basis of said diagnosis address definition information and said diagnosis group definition information, said second behavior level design data is generated by adding, to said first behavior level design data, behavior level design data for said diagnosis system, including:

A. a first diagnosis repeater circuit which receives from said diagnosis program input test data to be written into a variable to be diagnosed within said normal system, and returns to said diagnosis program output test data which is outputted from said variable to be diagnosed; and B. a second diagnosis repeater circuit, provided for each of said diagnosis groups, which receives said input test data from said first diagnosis repeater circuit and sends said input test data to a designated one among said plurality of diagnosis candidate block layers in said diagnosis groups, and which moreover receives said output test data from said designated one among said plurality of diagnosis candidate block layers in said diagnosis groups and returns said output test data to said first diagnosis repeater circuit.

17. The medium according to claim 16, wherein:

in said diagnostic logic automatic generation step, on the basis of said diagnosis address definition information and said diagnosis group definition information, said second behavior level design data is generated by adding, to said first behavior level design data, behavior level design data for said diagnosis system, further including:

A. said first diagnosis repeater circuit;

B. said second diagnosis repeater circuit, provided to each of said diagnosis groups;

C. a write diagnosis circuit, provided to each of said diagnosis candidate block layers in said diagnosis groups, which receives said input test data from said second diagnosis repeater circuit of said diagnosis group, and sends said input test data to a designated one among said plurality of diagnosis candidate sub-block layers in said diagnosis candidate block layers;

D. an internal diagnosis circuit, provided to each of said plurality of diagnosis candidate sub-block layers in said diagnosis candidate block layers, which receives said input test data from said write diagnosis circuit of said diagnosis candidate block layer, inputs said input test data to said variable to be diagnosed among said plurality of diagnosis candidate variables in said diagnosis candidate sub-block layer, and receives said output test data from said variable to be diagnosed;

E. a read diagnosis circuit, provided to each of said plurality of diagnosis candidate sub-block layers in said diagnosis candidate block layers, which receives said output test data from said internal diagnosis circuit in said diagnosis candidate sub-block layer; and F. a read diagnosis circuit, provided to each of said plurality of diagnosis candidate block layers in said diagnosis groups, which receives said output test data from said plurality of read diagnosis circuits in said diagnosis candidate block layer, and returns said output test data to said second diagnosis repeater circuit of said diagnosis groups.

18. The medium according to claim 17, said method further comprising a variable attribute decision step of, on the basis of said first behavior level design data, deciding to which of a predetermined plurality of variable attributes, including the following A), B), and C), each of said plurality of diagnosis candidate variables in said sub-block layers corresponds:
- A) a state management variable for specifying the state of a state machine in said sub-block layer;
- B) a local variable which is referred to only within said sub-block layer; and
- C) a channel variable for communication, for outputting data of a predetermined variable within said sub-block layer to a predetermined other sub-block layer;

and wherein, in said diagnostic logic automatic generation step, the result of decision by said variable attribution decision step is received, and said internal diagnosis circuits in said sub-block layers are generated upon said first behavior level design data by:
- a) adding a diagnosis state to the plurality of states possessed by said state machine;
- b) adding a mode setting communication channel for inputting diagnosis mode setting data and normal mode setting data for causing said state machine to transit between said diagnosis state and some other predetermined state;
- c) adding an input test data communication channel for, when said state machine is in said diagnosis state, writing said input test data from said write diagnosis circuit to said local variable and said variable for communication channel;
- d) adding a state management variable communication channel for, when said state machine is in said diagnosis state, treating data of said state management variable as said output test data, and reading it out to outside said sub-block layers; and
- e) adding a local variable communication channel for, when said state machine is in said diagnosis state, treating data of said local variable as said output test data, and reading it out to outside said sub-block layers.

19. The medium according to claim 18, wherein:
in said diagnostic logic automatic generation step, upon said first behavior level design data, further:
- ii) generates said read diagnosis circuit so as, when said state machine is in said diagnosis state: to read data of said state management variable via said state management variable communication channel, to read data of said local variable via said local variable communication channel, and to read data of said variable communication channel, and to treat the data which has been read as said output test data and to send it to said read diagnosis circuit; and moreover
- iii) adds an intermediate communication channel for transferring data which has been read out from said variable communication channel to said read diagnosis circuit from said diagnostic circuitry to another sub-block layer within said normal system.

20. A large scale integration (LSI) which is designed by a method for designing an LSI having both a normal system for performing normal functions, and a diagnosis system for communicating with a diagnosis micro-program which is executed externally to interject diagnosis data of said diagnosis micro-program into said normal system during momentary interruption of said normal system, to perform real-time detection of the occurrence of a fault of said normal system, said method comprising:

a behavior model design step of generating first behavior level design data, in which the logic of said normal system in said LSI is described, and including a plurality of variables;

a first high level synthesis step of inputting said first behavior level design data, and, on the basis of said first behavior level design data, generating both first register transfer level (RTL) design data in which the logic of said normal system is described and in which a plurality of hardware registers are included, and a high level synthesis log which specifies said plurality of hardware registers within said first RTL design data;

a diagnosis candidate analysis step of inputting said first behavior level design data and said high level synthesis log, and, on the basis of said first behavior level design data and said high level synthesis log, detecting, from a plurality of variables within said first behavior level design data, a plurality of diagnosis candidate variables which respectively correspond to said plurality of hardware registers within said first RTL design data, and generating diagnosis candidate information in which said mutually corresponding plurality of diagnosis candidate variables and said plurality of hardware registers are specified, where said plurality of diagnosis candidate variables are useable during said momentary interruption of said normal system, to perform said real-time detection of the occurrence of a fault during said operation of said normal system;

a register address setting step of inputting said diagnosis candidate information, mapping said plurality of hardware registers which are specified in said diagnosis candidate information onto a software address space to be used by said diagnosis micro-program during said momentary interruption of said normal system, to perform said real-time detection of the occurrence of a fault during said operation of said normal system, and generating diagnosis address definition information which specifies the address positions of a plurality of registers in said software address space;

a diagnostic logic automatic generation step of inputting said first behavior level design data and said diagnostic address definition information, and, on the basis of said first behavior level design data and said diagnostic address definition information, generating second behavior level design data for said LSI, in which both said normal system and said diagnosis system are included;

a second high level synthesis step of further inputting said second behavior level design data, and, on the basis of said second behavior level design data, generating second RTL design data, in which is described completed logic which includes logic for said normal system, as well as diagnostic system logic to be used by said diagnosis micro-program during said momentary interruption of said normal system, to perform said real-time detection of the occurrence of a fault during said operation of said normal system; and a logic synthesis step of inputting said second RTL design data, and, on the basis of said second RTL design data, generating gate level design data in which said completed logic is described.

* * * * *